(12) United States Patent
Lichtenwalner

(10) Patent No.: US 11,929,420 B2
(45) Date of Patent: Mar. 12, 2024

(54) POWER SEMICONDUCTOR DEVICES HAVING MULTILAYER GATE DIELECTRIC LAYERS THAT INCLUDE AN ETCH STOP/FIELD CONTROL LAYER AND METHODS OF FORMING SUCH DEVICES

(71) Applicant: Wolfspeed, Inc., Durham, NC (US)

(72) Inventor: Daniel J. Lichtenwalner, Raleigh, NC (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 17/668,448

(22) Filed: Feb. 10, 2022

(65) Prior Publication Data
US 2022/0165862 A1 May 26, 2022

Related U.S. Application Data

(63) Continuation of application No. 16/922,192, filed on Jul. 7, 2020, now Pat. No. 11,563,101.

(51) Int. Cl.
| | |
|---|---|
| *H01L 29/51* | (2006.01) |
| *H01L 29/16* | (2006.01) |
| *H01L 29/40* | (2006.01) |
| *H01L 29/78* | (2006.01) |

(52) U.S. Cl.
CPC ........ *H01L 29/513* (2013.01); *H01L 29/1608* (2013.01); *H01L 29/401* (2013.01); *H01L 29/7803* (2013.01); *H01L 29/7813* (2013.01); *H01L 29/517* (2013.01)

(58) Field of Classification Search
CPC . H01L 29/513; H01L 29/1608; H01L 29/401; H01L 29/7803; H01L 29/7813; H01L 29/517

USPC .......................................................... 257/77
See application file for complete search history.

(56) References Cited

U.S. PATENT DOCUMENTS

| | | | |
|---|---|---|---|
| 5,915,180 A | * 6/1999 | Hara | H01L 29/42368 257/77 |
| 9,812,532 B1 | 11/2017 | Chu et al. | |
| 2010/0006861 A1 | * 1/2010 | Yamamoto | H01L 29/086 257/77 |

(Continued)

FOREIGN PATENT DOCUMENTS

| | | | | |
|---|---|---|---|---|
| CN | 104952917 A | * | 9/2015 | ....... H01L 29/42316 |
| CN | 104952917 A | | 9/2015 | |

OTHER PUBLICATIONS

Invitation to Pay Additional Fees and Annex to the Invitation to Pay Additional Fees in corresponding PCT Application No. PCT/US2021/040415 (dated Oct. 28, 2021).

(Continued)

*Primary Examiner* — Igwe U Anya
(74) *Attorney, Agent, or Firm* — Myers Bigel, P.A.

(57) ABSTRACT

A semiconductor device includes a semiconductor layer structure that comprises silicon carbide, a gate dielectric layer on the semiconductor layer structure, the gate dielectric layer including a base gate dielectric layer that is on the semiconductor layer structure and a capping gate dielectric layer on the base gate dielectric layer opposite the semiconductor layer structure, and a gate electrode on the gate dielectric layer opposite the semiconductor layer structure. A dielectric constant of the capping gate dielectric layer is higher than a dielectric constant of the base gate dielectric layer.

23 Claims, 9 Drawing Sheets

(56) References Cited

U.S. PATENT DOCUMENTS

| | | | |
|---|---|---|---|
| 2012/0052642 A1* | 3/2012 | Endo | H01L 29/4236 438/270 |
| 2012/0061682 A1* | 3/2012 | Yamamoto | H01L 29/45 257/77 |
| 2012/0273801 A1* | 11/2012 | Watanabe | H01L 29/7813 257/77 |
| 2013/0009256 A1 | 1/2013 | Okumura et al. | |
| 2013/0168701 A1* | 7/2013 | Kiyosawa | H01L 21/049 257/77 |
| 2013/0256747 A1 | 10/2013 | Sin et al. | |
| 2013/0313609 A1 | 11/2013 | Akutsu et al. | |
| 2014/0191288 A1 | 7/2014 | Kotani et al. | |
| 2015/0097226 A1 | 4/2015 | Lichtenwalner et al. | |
| 2016/0343823 A1* | 11/2016 | Akram | H01L 29/7813 |
| 2017/0170288 A1* | 6/2017 | Kiyosawa | H01L 21/02378 |
| 2017/0365664 A1 | 12/2017 | Iijima et al. | |
| 2018/0097102 A1* | 4/2018 | Baba | H01L 29/1608 |
| 2018/0286974 A1* | 10/2018 | Kumazawa | H01L 29/41741 |
| 2019/0140092 A1* | 5/2019 | Utsumi | H01L 21/3247 |

OTHER PUBLICATIONS

"Notification of Transmittal of the International Search Report and the Written Opinion of the International Searching Authority, or the Declaration for corresponding International Application No. PCT/US2021/040415, dated Dec. 20, 2021, (25 pages)".

Hussain, M., et al., ""Metal Wet Etch Issues and Effects in Dual Metal Gate Stack Integration," Journal of The Electrochemical Society, 153(5):G389-G393, (2006)".

Wilk, G. D., et al., ""High-k gate dielectrics: Current status and materials properties considerations," Journal of Applied Physics, 89(10):5243-5275, (2001)".

* cited by examiner

POWER SEMICONDUCTOR DEVICES HAVING MULTILAYER GATE DIELECTRIC LAYERS THAT INCLUDE AN ETCH STOP/FIELD CONTROL LAYER AND METHODS OF FORMING SUCH DEVICES

CROSS-REFERENCE TO RELATED APPLICATION

The present application is a continuation of, and claims priority under 35 U.S.C. § 120 to, U.S. patent application Ser. No. 16/922,192, filed Jul. 7, 2020, the entire content of which is incorporated herein by reference.

FIELD

The present invention relates to semiconductor devices and, more particularly, to power semiconductor switching devices

BACKGROUND

The Metal Insulating Semiconductor Field Effect Transistor ("MISFET") is a well-known type of semiconductor transistor that may be used as a switching device. A MISFET is a three terminal device that has gate, drain and source terminals and a semiconductor body. A source region and a drain region are formed in the semiconductor body that are separated by a channel region, and a gate electrode (which may act as the gate terminal or be electrically connected to the gate terminal) is separated from the channel region by a thin insulating layer that is referred to as a "gate dielectric layer." A MISFET may be turned on or off by applying a bias voltage to the gate electrode. When a MISFET is turned on (i.e., it is in its "on-state"), current is conducted through the channel region of the MISFET between the source region and drain regions. When the bias voltage is removed from the gate electrode (or reduced below a threshold level), the current ceases to conduct through the channel region. By way of example, an n-type MISFET has n-type source and drain regions and a p-type channel. An n-type MISFET thus has an "n-p-n" design. An n-type MISFET turns on when a gate bias voltage is applied to the gate electrode that is sufficient to create a conductive n-type inversion layer in the p-type channel region that electrically connects the n-type source and drain regions, thereby allowing for majority carrier conduction therebetween.

In most cases, the gate dielectric layer that separates the gate electrode of a power MISFET from the channel region is implemented as a thin oxide layer (e.g., a silicon oxide layer). A MISFET that has an oxide gate dielectric layer is referred to as a Metal Oxide Semiconductor Field Effect Transistor ("MOSFET"). As oxide-based gate dielectric layers are almost always used due to their superior properties, the discussion herein will focus on MOSFETs as opposed to MISFETs, but it will be appreciated that the techniques according to embodiments of the present invention that are described herein are equally applicable to devices having gate dielectric layers formed with materials other than oxides.

Because the gate electrode of a MOSFET is insulated from the channel region by the gate dielectric layer, minimal gate current is required to maintain the MOSFET in its on-state or to switch a MOSFET between its on-state and its off-state. The gate current is kept small during switching because the gate forms a capacitor with the channel region. Thus, only minimal charging and discharging current is required during switching, allowing for less complex gate drive circuitry and faster switching speeds. MOSFETs may be stand-alone devices or may be combined with other circuit devices. For example, an Insulated Gate Bipolar Transistor ("IGBT") is a semiconductor device that includes both a MOSFET and a Bipolar Junction Transistor ("BJT") that combines the high impedance gate electrode of the MOSFET with small on-state conduction losses that may be provided by a BJT. An IGBT may be implemented, for example, as a Darlington pair that includes a high voltage n-channel MOSFET at the input and a BJT at the output. The base current of the BJT is supplied through the channel of the MOSFET, thereby allowing a simplified external drive circuit (since the drive circuit only charges and discharges the gate electrode of the MOSFET).

There is an increasing demand for high power semiconductor switching devices that can pass large currents in their on-state and block large voltages (e.g., thousands of volts) in their reverse blocking state. In order to support high current densities and block such high voltages, power MOSFETs and IGBTs typically have a vertical structure with the source and drain on opposite sides of (e.g., on top and bottom of) a thick semiconductor layer structure in order to block higher voltage levels. In very high power applications, the semiconductor switching devices are typically formed in wide band-gap semiconductor material systems (herein, the term "wide band-gap semiconductor" encompasses any semiconductor having a band-gap of at least 1.4 electron volts ("eV")) such as, for example, silicon carbide ("SiC"), which has a number of advantageous characteristics including, for example, a high electric field breakdown strength, high thermal conductivity, high electron mobility, high melting point and high-saturated electron drift velocity. Relative to devices formed using other semiconductor materials such as, for example, silicon, electronic devices formed using silicon carbide may have the capability of operating at higher temperatures, at high power densities, at higher speeds, at higher power levels and/or under high radiation densities.

One failure mechanism for a power MOSFET is so-called "breakdown" of the gate oxide layer. When power MOSFETs are in their conducting or on-state, the gate oxide layer is subjected to high electric fields. The stress on the gate oxide layer caused by these electric fields generates defects in the oxide material that build up over time. When the concentration of defects reaches a critical value, a so-called "percolation path" may be created through the gate oxide layer that electrically connects the gate electrode to the source region underlying semiconductor layer structure, thereby short-circuiting the gate electrode and the source region, which can destroy the device. The "lifetime" of a gate oxide layer (i.e., how long the device can be operated before breakdown occurs) is a function of, among other things, the magnitude of the electric field that the gate oxide layer is subjected to and the length of time for which the electric field is applied. FIG. 1 is a schematic semi-log graph illustrating the relationship between the operating time until breakdown occurs (the "gate oxide lifetime") and the level of the electric field applied to the gate oxide layer. This graph assumes that the same electric field is always applied (which is not necessarily the case), and assumes a gate oxide layer having a certain thickness. The important point to take from FIG. 1 is that the log of the gate oxide lifetime and the electric field can have a straight-line relationship, and thus as the electric field level is increased, the lifetime of the gate oxide layer may decrease. The lifetime of the gate oxide layer may be increased by increasing the thickness of the gate oxide layer, but the performance of the MOSFET also is a function of the thickness of the gate oxide layer and thus increasing the thickness of the gate oxide layer is typically not an acceptable way of increasing the lifetime of the gate oxide layer.

Power silicon carbide based MOSFETs are in use today for applications requiring high voltage blocking. By way of example, silicon carbide MOSFETs are commercially available that are rated for current densities of 10 A/cm$^2$ or more that will block voltages from 300 V to 20 kV or higher. To form such devices, a plurality of "unit cells" are typically formed, where each unit cell includes a MOSFET transistor. In high power applications, a large number of these unit cells (e.g., hundreds or thousands) are typically provided on/in a semiconductor layer structure, and a gate electrode layer is formed on a top side of the semiconductor layer structure that acts as the gate electrode for all of the unit cells. The opposite (bottom) side of the semiconductor layer structure acts as a common drain for all of the unit cells of the device. A plurality of source contacts are formed on source regions in the semiconductor layer structure that are exposed within openings in the gate electrode layer. These source contacts are also electrically connected to each other to serve as a common source. The resulting device has three terminals, namely a common source terminal, a common drain terminal and a common gate electrode that act as the terminals for the hundreds or thousands of individual unit cell transistors that are electrically connected in parallel.

FIG. 2 is a schematic cross-sectional view of a conventional silicon carbide vertical power MOSFET 100 that has the above-described unit cell structure. FIG. 2 is a cross-section of a single unit cell of the device. As shown in FIG. 2, the MOSFET 100 includes a heavily-doped (n+) n-type silicon carbide semiconductor substrate 110. A lightly-doped n-type (n−) silicon carbide drift layer 120 is provided on the silicon carbide substrate 110. Regions referred to as "wells" or "p-wells" 130 that are doped to have p-type conductivity are formed in upper portions of the n-type silicon carbide drift layer 120. The p-wells 130 may be formed, for example, by counter-doping portions of the n-type silicon drift layer 120 with p-type dopants. Heavily-doped (n+) n-type silicon carbide source regions 140 are provided in upper portions of the p-wells 130. The n-type source regions 140 may be formed, for example, by counter-doping portions of the p-wells 130 with n-type dopants. The drift layer 120 and the substrate 110 together act as a common drain region for the device 100. The n-type silicon carbide substrate 110, n-type silicon carbide drift layer 120, the p-type silicon carbide p-wells 130, and the n-type silicon carbide source regions 140 together comprise a semiconductor layer structure 150 of the MOSFET 100. A silicon dioxide (SiO$_2$) gate oxide layer 160 is formed on the upper surface of the semiconductor layer structure 150. A gate electrode 170 is provided on the gate oxide layer 160 opposite the semiconductor layer structure 150. The gate electrode 170 is typically formed of polysilicon. A dielectric isolation pattern 180 is formed on the gate oxide layer 160 and the gate electrode 170, and source metallization 190 is formed on the dielectric isolation pattern 180 and on the exposed source regions 140. A drain contact (not shown) is typically provided on the lower surface of the substrate 110, opposite the drift layer 120.

SUMMARY

Pursuant to embodiments of the present invention, semiconductor devices are provided that include a semiconductor layer structure that comprises silicon carbide, a gate dielectric layer on the semiconductor layer structure, and a gate electrode on the gate dielectric layer opposite the semiconductor layer structure. The gate dielectric layer includes a base gate dielectric layer that is on the semiconductor layer structure and a capping gate dielectric layer on the base gate dielectric layer opposite the semiconductor layer structure. A dielectric constant of the capping gate dielectric layer is higher than a dielectric constant of the base gate dielectric layer.

In some embodiments, the capping gate dielectric layer thinner than the base gate dielectric layer.

In some embodiments, the base gate dielectric layer may be a silicon oxide layer.

In some embodiments, the base gate dielectric layer may be at least five times thicker than the capping gate dielectric layer and the dielectric constant of the capping gate dielectric layer may be at least three times more than the dielectric constant of the base gate dielectric layer.

In some embodiments, the gate electrode may include silicon.

In some embodiments, the semiconductor layer structure further comprises a first well region and a second well region that are separated by a JFET region, and the capping gate dielectric layer is not on an upper surface of the JFET region.

In some embodiments, the gate electrode may have a stepped lower surface.

In some embodiments, opposed upper edges of the gate electrode may be farther above the semiconductor layer structure than is a central portion of the upper surface of the gate electrode.

In some embodiments, the capping gate dielectric layer may be only on a portion of the base gate dielectric layer.

In some embodiments, the semiconductor layer structure may include a drift layer having a first conductivity type, a well having a second conductivity type in an upper portion of the drift layer and a source region having the first conductivity type in an upper portion of the well. A channel region may be provided in the well between the source region and a portion of the drift layer that directly contacts the gate dielectric layer.

In some embodiments, the capping gate dielectric layer may be formed on source region and may not be formed the portion of the drift layer that directly contacts the gate dielectric layer.

In some embodiments, the semiconductor device may be configured so that during on-state operation a peak electric field value in the gate dielectric layer will be located substantially at an upper surface of the base gate dielectric layer underneath a side edge of the gate electrode.

In some embodiments, the semiconductor device may be configured so that during on-state operation a peak electric field value in the base gate dielectric layer is at least 50% greater than a peak electric field value in the capping gate dielectric layer.

In some embodiments, the semiconductor device may be a MISFET or an IGBT.

In some embodiments, a thickness of the gate dielectric layer may be at least twenty-five nanometers.

In some embodiments, the capping gate dielectric layer may comprise an etch stop layer with respect to the gate electrode.

In some embodiments, a ratio of a thickness of the base gate dielectric layer divided by a dielectric constant of a material of the base gate dielectric layer to a thickness of the capping gate dielectric layer divided by a dielectric constant of a material of the capping gate dielectric layer may be at least ten.

In some embodiments, the semiconductor layer structure may include a trench in an upper surface thereof, and the gate dielectric layer and the gate electrode may each be at least partially within the trench.

In some embodiments, at least some corners of the trench may be rounded.

Pursuant to further embodiments of the present invention, semiconductor devices are provided that include a semiconductor layer structure that comprises silicon carbide, a gate dielectric layer on the semiconductor layer structure, and a gate electrode on the gate dielectric layer opposite the semiconductor layer structure. The semiconductor device is configured so that a peak electric field in the gate dielectric layer during on-state operation is below a top surface of the gate dielectric layer.

In some embodiments, the gate layer may comprise a base gate dielectric layer that is on the semiconductor layer structure and a capping gate dielectric layer on the base gate dielectric layer opposite the semiconductor layer structure.

In some embodiments, the semiconductor device may be configured so that the peak electric field in the gate dielectric layer during on-state operation is in the base gate dielectric layer.

In some embodiments, the semiconductor device may be configured so that the peak electric field value in the gate dielectric layer during on-state operation a is located substantially at an upper surface of the base gate dielectric layer underneath a side edge of the gate electrode.

In some embodiments, the semiconductor device may be configured so that the peak electric field in the gate dielectric layer during on-state operation is at least 2 nm below a top surface of the gate dielectric layer.

In some embodiments, the capping gate dielectric layer may be thinner than the base gate dielectric layer.

In some embodiments, the base gate dielectric layer may comprise a silicon oxide layer and the gate electrode comprises silicon.

In some embodiments, the base gate dielectric layer may be at least five times thicker than the capping gate dielectric layer and a dielectric constant of the capping gate dielectric layer may be at least three times more than a dielectric constant of the base gate dielectric layer.

In some embodiments, the semiconductor layer structure may include a drift layer having a first conductivity type, first and second wells that each have a second conductivity type in spaced apart upper portions of the drift layer, first and second source regions having the first conductivity type in upper portions of the respective first and second wells, a JFET region having the first conductivity type between the first and second wells, and first and second channel regions provided in the respective first and second wells between the respective first and second source regions and the JFET region.

In some embodiments, the capping gate dielectric layer may not be on an upper surface of the JFET region.

In some embodiments, the gate electrode may have a stepped lower surface.

In some embodiments, opposed upper edges of the gate electrode may be farther above the semiconductor layer structure than is a central portion of the upper surface of the gate electrode.

In some embodiments, the capping gate dielectric layer may only be formed on a portion of the base gate dielectric layer.

In some embodiments, the semiconductor device may be configured so that during on-state operation a peak electric field value in the gate dielectric layer will be located substantially at an upper surface of the base gate dielectric layer underneath a side edge of the gate electrode.

In some embodiments, the semiconductor device may be configured so that during on-state operation a peak electric field value in the base gate dielectric layer is at least 50% greater than a peak electric field value in the capping gate dielectric layer.

In some embodiments, a ratio of a thickness of the base gate dielectric layer divided by a dielectric constant of a material of the base gate dielectric layer to a thickness of the capping gate dielectric layer divided by a dielectric constant of a material of the capping gate dielectric layer may be at least ten or at least fifteen.

In some embodiments, the semiconductor layer structure may include a trench in an upper surface thereof, and the gate dielectric layer and the gate electrode may each be at least partially within the trench.

In some embodiments, upper corners of the trench may be rounded corners, and the gate dielectric layer may be conformally provided on the semiconductor layer structure and within the trench.

In some embodiments, lower corners of the trench may be rounded corners, and the gate dielectric layer may be conformally provided within the trench.

Pursuant to additional embodiments of the present invention, semiconductor devices are provided that include a semiconductor layer structure that comprises a silicon carbide drift layer having a first conductivity type, first and second silicon carbide wells that each have a second conductivity type in respective upper portions of the drift layer, first and second silicon carbide source regions having the first conductivity type in upper portions of the respective first and second wells, and a JFET region having the first conductivity type between the first and second wells, a gate dielectric layer on the semiconductor layer structure, the gate dielectric layer including a silicon oxide base gate dielectric layer that is on the semiconductor layer structure and a capping gate dielectric layer on the base gate dielectric layer opposite the semiconductor layer structure, and a silicon gate electrode on the gate dielectric layer opposite the semiconductor layer structure. The semiconductor device is configured so that during on-state operation a peak electric field value in the base gate dielectric layer is at least 50% greater than a peak electric field value in the capping gate dielectric layer.

In some embodiments, the base gate dielectric layer may be at least five times thicker than the capping gate dielectric layer and a dielectric constant of the capping gate dielectric layer may be at least three times more than a dielectric constant of the base gate dielectric layer.

In some embodiments, the semiconductor device may be configured so that the peak electric field in the gate dielectric layer during on-state operation is in the base gate dielectric layer.

In some embodiments, the semiconductor device may be configured so that the peak electric field value in the gate dielectric layer during on-state operation a is located substantially at the upper surface of the base gate dielectric layer underneath a side edge of the gate electrode.

In some embodiments, the capping gate dielectric layer is not above an upper surface of the JFET region.

In some embodiments, the gate electrode may have a stepped lower surface.

In some embodiments, opposed upper edges of the gate electrode may be farther above the semiconductor layer structure than is a central portion of the upper surface of the gate electrode.

In some embodiments, the capping gate dielectric layer is only formed on a portion of the base gate dielectric layer.

In some embodiments, the semiconductor layer structure may include a trench in an upper surface thereof, and wherein the gate dielectric layer and the silicon gate electrode are each at least partially within the trench.

In some embodiments, a ratio of a thickness of the base gate dielectric layer divided by a dielectric constant of a material of the base gate dielectric layer to a thickness of the capping gate dielectric layer divided by a dielectric constant of a material of the capping gate dielectric layer may be at least ten.

Pursuant to still further embodiments of the present invention, methods of forming a semiconductor device are provided in which a semiconductor layer structure is formed that includes a silicon carbide drift layer having a first conductivity type, first and second silicon carbide wells that each have a second conductivity type in respective upper portions of the drift layer, first and second silicon carbide source regions having the first conductivity type in upper portions of the respective first and second wells, and a JFET region having the first conductivity type between the first and second wells. A base gate dielectric layer is formed on the semiconductor layer structure. A capping gate dielectric layer is formed on the base gate dielectric layer, the capping gate dielectric layer having a dielectric constant that is greater than a dielectric constant of the base gate dielectric layer. A gate electrode comprising silicon is formed on the capping gate dielectric layer opposite the semiconductor layer structure. Portions of the base gate dielectric layer and the capping gate dielectric layer are removed to form a base gate dielectric layer and a capping gate dielectric layer that together form at least part of a gate dielectric layer.

In some embodiments, forming the capping gate dielectric layer on the base gate dielectric layer comprises forming a mask on the semiconductor layer structure after forming the base gate dielectric layer, forming the capping gate dielectric layer on both the mask and the base gate dielectric layer, and removing the mask layer and a portion of the capping gate dielectric layer to expose a portion of the base gate dielectric layer.

In some embodiments, the portion of the base gate dielectric layer that is exposed includes a portion of the base gate dielectric layer that is above the JFET region.

In some embodiments, the capping gate dielectric layer may be thinner than the base gate dielectric layer.

In some embodiments, the base gate dielectric layer may be at least five times thicker than the capping gate dielectric layer and the dielectric constant of the capping gate dielectric layer may be at least three times more than the dielectric constant of the base gate dielectric layer.

In some embodiments, forming the gate electrode comprising silicon on the capping gate dielectric layer opposite the semiconductor layer structure comprises blanket depositing a gate electrode layer on the base gate dielectric layer and the capping gate dielectric layer and then etching the gate electrode layer using the capping gate dielectric layer as an etch stop layer to form the gate electrode.

In some embodiments, the gate electrode may have a stepped lower surface.

In some embodiments, the semiconductor device may be configured so that during on-state operation a peak electric field value in the base gate dielectric layer is at least 50% greater than a peak electric field value in the capping gate dielectric layer.

Pursuant to embodiments of the present invention, semiconductor devices are provided that include a semiconductor layer structure that comprises silicon carbide, the semiconductor layer structure including a trench formed therein, where at least some corners of the trench are rounded, a gate dielectric layer on the semiconductor layer structure and within the trench, the gate dielectric layer including lower corners and upper corners, where at least one of the lower corners and upper corners comprises a rounded corner, and a gate electrode on the gate dielectric layer opposite the semiconductor layer structure.

In some embodiments, the gate dielectric layer may comprise a silicon oxide base gate dielectric layer and a capping gate dielectric layer on an upper surface of the base gate dielectric layer.

In some embodiments, a dielectric constant of the capping gate dielectric layer may be at least three times more than a dielectric constant of the base gate dielectric layer.

In some embodiments, the semiconductor layer structure may include a drift layer having a first conductivity type, a well having a second conductivity type in an upper portion of the drift layer and a source region having the first conductivity type in an upper portion of the well.

In some embodiments, the semiconductor device may be configured so that during on-state operation a peak electric field value in the base gate dielectric layer is at least 50% greater than a peak electric field value in the capping gate dielectric layer.

In some embodiments, a thickness of the capping gate dielectric layer may be between two and fifteen nanometers.

DETAILED DESCRIPTION

When a MOSFET is in its conducting or on-state, an electric field is generated within the gate dielectric layer of the device. The strength of this electric field may be particularly high in the portions of the gate dielectric layer that are directly underneath the sidewalls of the gate electrode. As discussed above, the lifetime of the gate dielectric layer is a function of the intensity of the electric field in the gate dielectric layer. Thus, since the portions of the gate dielectric layer that are underneath the sidewalls of the gate electrode are subjected to the highest electric fields, these are the regions that will typically first experience breakdown.

Figure 2:
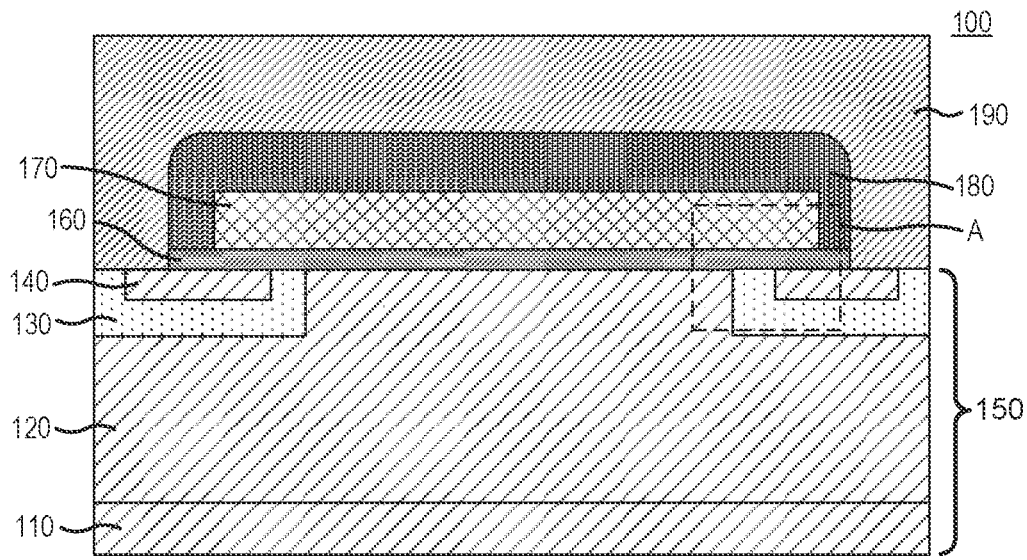
FIG. 2 is a schematic cross-sectional view of a unit cell of a conventional silicon carbide MOSFET.

As discussed above with reference to FIG. 2, power silicon carbon MOSFETs typically include polysilicon gate electrodes 170. The polysilicon gate electrodes 170 are formed by blanket depositing a polysilicon layer on the upper surface of the device and then etching the polysilicon layer to form a gate electrode layer that includes the individual gate electrodes 170. Since the gate dielectric layer is formed of silicon oxide and the gate electrode is formed of silicon, the etchant(s) used to etch away unwanted portions of the gate electrode layer may also tend to readily etch silicon oxide due to the similarities between the two materials. Conventionally, if over-etching occurs during this etching step, the portion of the silicon oxide gate dielectric layer 160 that is directly underneath the sidewalls of the gate electrode 170 may be partially etched away due to the over-etching. Thus, the portion of the gate dielectric layer 160 that may be potentially over-etched is also the portion of the gate dielectric layer 160 that experiences the highest electric field values during on-state operation, which makes this portion of the gate dielectric layer 160 particularly susceptible to breakdown. Moreover, this portion of the gate dielectric layer 160 directly overlies the source region 140. Since the failure mechanism for a MOSFET experiencing breakdown is the development of a short circuit between the gate electrode 170 and the source region 140, the fact that the portion of the gate dielectric layer 160 that directly overlies the source region 140 is the portion that is most susceptible to breakdown tends to shorten the time to device failure due to breakdown.

Figure 1:
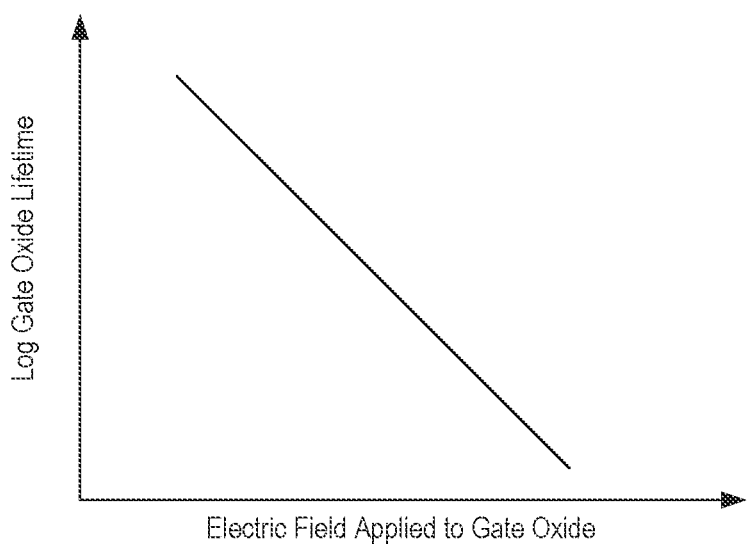
FIG. 1 is a semi-log graph illustrating the relationship between the lifetime of the gate dielectric layer as a function of applied electric field strength.

Pursuant to embodiments of the present invention, power semiconductor devices are provided that have multilayer gate dielectric layers that will exhibit increased lifetimes. In particular, the gate dielectric layers may include at least a silicon oxide base gate dielectric layer (or base gate dielectric layer formed of some other dielectric material such as, for example, silicon nitride) that is formed on the semiconductor layer structure and a high dielectric constant capping gate dielectric layer that is formed on at least a portion of the silicon oxide base gate dielectric layer. Additional layers may also be included. For example, a multilayer base gate dielectric layer may be provided. As another example, a second capping gate dielectric layer may be provided that is located, for example, directly on the first capping gate dielectric layer or on the base gate dielectric layer opposite the first capping gate dielectric layer. The high dielectric constant capping gate dielectric layer may be formed of a material that acts as an etch stop layer during the etching of the gate electrode layer to form the gate electrodes of the device. In particular, most high dielectric constant gate dielectric materials are chemically quite different from silicon and hence etchants are readily available that will readily etch silicon that do not etch these high dielectric constant gate dielectric materials. As such, the high dielectric constant capping gate dielectric layer may protect the underlying silicon oxide base gate dielectric layer from over-etching during this etching step. Moreover, the electric field levels in the gate dielectric layer are a function of the dielectric constant of the material(s) used to form the gate dielectric layer, with the electric field strength decreasing with increasing dielectric constant. As such, the electric field strength in the high dielectric constant capping gate dielectric layer will be less than the electric field strength in the same portion of the silicon oxide gate dielectric layer of a conventional power semiconductor device. Additionally, as discussed above, the location where the electric field in the conventional gate dielectric layer 160 reaches its maximum value during on-state operation are the top portions of the gate dielectric layer 160 that are underneath the outer edge of the gate electrode 170. Since the top portion of the gate dielectric layers according to embodiments of the present invention are formed using a high dielectric constant material, the strength of the electric field in these regions will be reduced as compared to the conventional gate dielectric layer 160. Since the peak electric field value is reduced, the lifetime of the gate dielectric layer may be extended, as discussed above with reference to FIG. 1.

Typically, the thickness of a conventional gate dielectric layer is based on a desired equivalent electrical oxide thickness which optimizes various performance characteristics of the device. If the equivalent electrical oxide thickness is to be maintained when a high dielectric constant capping gate dielectric layer is added to the gate dielectric layer, it then becomes necessary to reduce the thickness of the original or silicon oxide "base" gate dielectric layer. Such a reduction in the thickness of the base gate dielectric layer acts to increase electric field strength in the silicon oxide of the base gate dielectric layer. In order to keep this increase in the electric field strength in the silicon oxide base gate dielectric layer to acceptable levels, the high dielectric constant capping gate dielectric layer may be a very thin layer that is substantially thinner than the silicon oxide base gate dielectric layer (e.g., on the order of $\frac{1}{4}^{th}$ the thickness in an example embodiment). In some embodiments, the high dielectric constant capping gate dielectric layer may have a thickness of less than ten nanometers.

The material of the high dielectric constant capping gate dielectric layer may be selected based on a number of factors. The chemical properties of the high dielectric constant material should be chemically compatible with the materials of underlying and overlying layers/patterns in the device. The dielectric constant of the material may also be considered, as the higher the dielectric constant the thicker the capping gate dielectric layer can be made, and/or the more the electric field strength in the high dielectric constant capping gate dielectric layer may be reduced. Additionally, the effectiveness of the material of the high dielectric constant capping gate dielectric layer as an etch stop layer, given the etch chemistry used to pattern the gate electrode, is another factor that should be considered. The material high dielectric constant capping gate dielectric layer also preferably remains substantially amorphous during any subsequent high temperature processing steps so that grain boundaries are not formed through the layer that may act as diffusion paths for etchants.

The multilayer gate dielectric layers according to embodiments of the present invention may be used in both planar MOSFETs (and similar devices) as well as in devices having a gate trench structure. When the gate dielectric layers according to embodiments of the present invention are used in devices having a gate trench structure, techniques may be used to round the corners of the gate trench before the gate dielectric layer is formed therein. By rounding the corners (including both the lower and upper corners) of the gate trench, the electric field crowding effect may be reduced, which may further reduce the peak electric field value experienced during on-state operation in the gate dielectric layer, which may increase the life of the device. The techniques for rounding the corners of the gate trench that are disclosed herein may also be used independently of the multilayer gate dielectric layers to improve the performance of conventional power semiconductor devices.

The power semiconductor devices according to embodiments of the present invention may perform almost identically to a conventional power semiconductor device that includes a conventional silicon oxide gate dielectric layer, while exhibiting significantly improved device reliability. For example, the peak electric field in the gate dielectric layers of the power semiconductor devices according to embodiments of the present invention may be 20%, 30%, 40%, 50% or more lower than the peak electric fields in the gate dielectric layers of comparable conventional power semiconductor devices. Moreover, the gate dielectric layers in the power semiconductor devices according to embodiments of the present invention may be significantly less susceptible to etch damage during the etching of the gate electrode layer, and hence may both have longer expected lifetimes and fewer instances of premature device failure.

Pursuant to some embodiments of the present invention, power semiconductor devices are provided that include a semiconductor layer structure that comprises silicon carbide, a gate dielectric layer on the semiconductor layer structure, the gate dielectric layer including a base gate dielectric layer that is on the semiconductor layer structure and a capping gate dielectric layer on the base gate dielectric layer opposite the semiconductor layer structure, and a gate electrode on the gate dielectric layer opposite the semiconductor layer structure. A dielectric constant of the capping gate dielectric layer is higher than a dielectric constant of the base gate dielectric layer. The capping gate dielectric layer may be thinner than the base gate dielectric layer.

Pursuant to further embodiments of the present invention, power semiconductor devices are provided that include a semiconductor layer structure that comprises silicon carbide, a gate dielectric layer on the semiconductor layer structure, and a gate electrode on the gate dielectric layer opposite the semiconductor layer structure. The semiconductor device is configured so that a peak electric field in the gate dielectric layer during on-state operation is below a top surface of the gate dielectric layer.

Pursuant to still further embodiments of the present invention, power semiconductor devices are provided that include a semiconductor layer structure that includes a silicon carbide drift layer having a first conductivity type, first and second silicon carbide wells that each have a second conductivity type in respective upper portions of the drift layer, first and second silicon carbide source regions having the first conductivity type in upper portions of the respective first and second wells, and a JFET region having the first conductivity type between the first and second wells. These devices further include a gate dielectric layer on the semiconductor layer structure, the gate dielectric layer including a silicon oxide base gate dielectric layer that is on the semiconductor layer structure and a capping gate dielectric layer on the base gate dielectric layer opposite the semiconductor layer structure and a silicon gate electrode on the gate dielectric layer opposite the semiconductor layer structure. The semiconductor device is configured so that during on-state operation a peak electric field value in the base gate dielectric layer is at least 50% greater than a peak electric field value in the capping gate dielectric layer.

Pursuant to further embodiments of the present invention, methods of forming semiconductor devices are provided in which a semiconductor layer structure that includes a silicon carbide drift layer having a first conductivity type, first and second silicon carbide wells that each have a second conductivity type in respective upper portions of the drift layer, first and second silicon carbide source regions having the first conductivity type in upper portions of the respective first and second wells, and a JFET region having the first conductivity type between the first and second wells. A base gate dielectric layer is formed on the semiconductor layer structure. A capping gate dielectric layer is formed on the base gate dielectric layer, the capping gate dielectric layer having a dielectric constant that is greater than a dielectric constant of the base gate dielectric layer. A gate electrode comprising silicon is formed on the capping gate dielectric layer opposite the semiconductor layer structure.

Semiconductor devices according to embodiments of the present invention will now be described in greater detail with reference to FIGS. 3A-12.

As discussed above, one common failure mechanism in power semiconductor devices is device failure due to breakdown of the gate dielectric layer. Since the lifetime (i.e., time until breakdown) of a gate dielectric layer is a function of the intensity of the electric field in the gate dielectric layer during device operation, one way to reduce the instances of device failure is to design the device to have reduced peak electric field values in the gate dielectric layer. While there are known ways to accomplish this, such as forming the gate dielectric layer of a material having a higher dielectric constant, the available techniques for reducing the electric field values typically negatively impact the electrical performance of the device.

The intensity of the electric field that is generated in the gate dielectric layer of a conventional power semiconductor device during on-state operation is not constant. The gate dielectric layer of the conventional power semiconductor device of FIG. 2 may be viewed as the dielectric of a parallel plate capacitor, with the gate electrode acts as a first plate of the capacitor and the portion of the semiconductor layer structure underneath the gate electrode acts as the other plate. During on-state operation, the electric field will have a generally constant value throughout a "parallel-plate" region of the gate dielectric layer, which refers to the central region of the portion of the gate dielectric layer that is underneath the gate electrode. However, in the "corner regions" of the gate dielectric layer due, which are the portions of the gate dielectric layer that are directly or nearly underneath the side edges of the gate electrode, electric field crowding effects increase the level of the electric field, particularly in the upper portion of the gate dielectric layer.

Figure 3A:
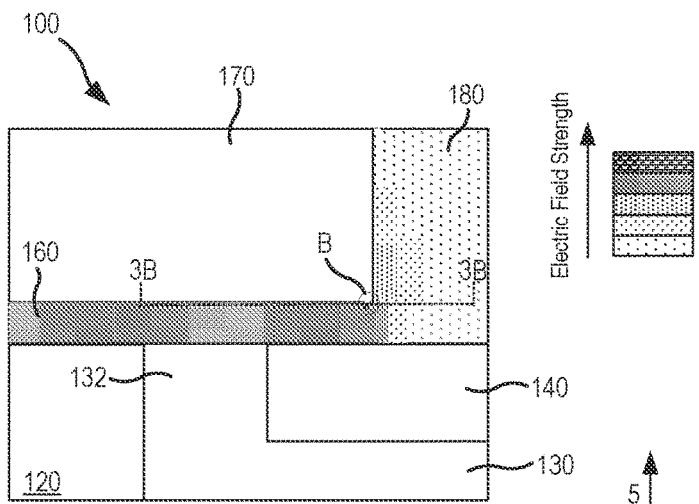
FIG. 3A is an enlarged view of a portion A of the conventional silicon carbide MOSFET of FIG. 2 that shows the electric field values in the gate dielectric layer and dielectric isolation pattern thereof.
Figure 3B:
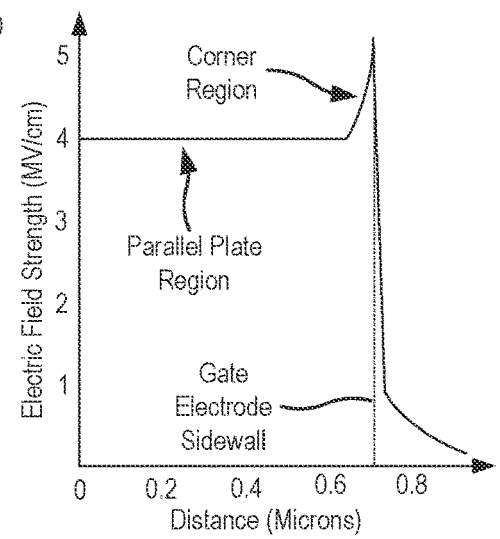
FIG. 3B is a graph showing the simulated electric field strength in the gate dielectric layer along the line 3B-3B of the conventional silicon carbide MOSFET of FIG. 2 during on-state operation.

This phenomena is shown in FIGS. 3A and 3B. In particular, FIG. 3A is an enlarged view of a portion "A" of FIG. 2 that shows the electric field values in the gate dielectric layer and dielectric isolation pattern thereof. In FIG. 3A, the different fill patterns indicate different electrical field strengths in the gate dielectric layer and dielectric isolation pattern, with the legend showing the relative values of the different shadings. FIG. 3B is a graph showing the simulated electric field strength in the gate dielectric layer during on-state operation along the line 3B-3B of FIG. 3A. As can be seen, in the "parallel plate" region of the gate dielectric layer 160, the electric field strength is relatively constant. However, the electric field strength increases sharply in the corner region, reaching a peak in the region labelled "B" in FIG. 3A, which is the top surface of the portion of the gate dielectric layer 160 that is directly underneath the sidewall of the gate electrode 170. Since the peak electric field in this corner region is about 25% greater than the peak electric field values in the parallel plate region of the gate dielectric layer 160, this corner region is the portion of the gate dielectric layer 160 that is most likely to first experience breakdown, which results in higher electric fields on surrounding dielectric material as breakdown occurs, eventually resulting in failure of the device As will be discussed in detail below, the semiconductor devices according to embodiments of the present invention may both move the location where the peak electric field occurs, and reduce the peak value of the electric field. Consequently, the semiconductor devices according to embodiments of the present invention may have increased lifetimes until dielectric breakdown and hence may exhibit improved reliability.

Figure 4:
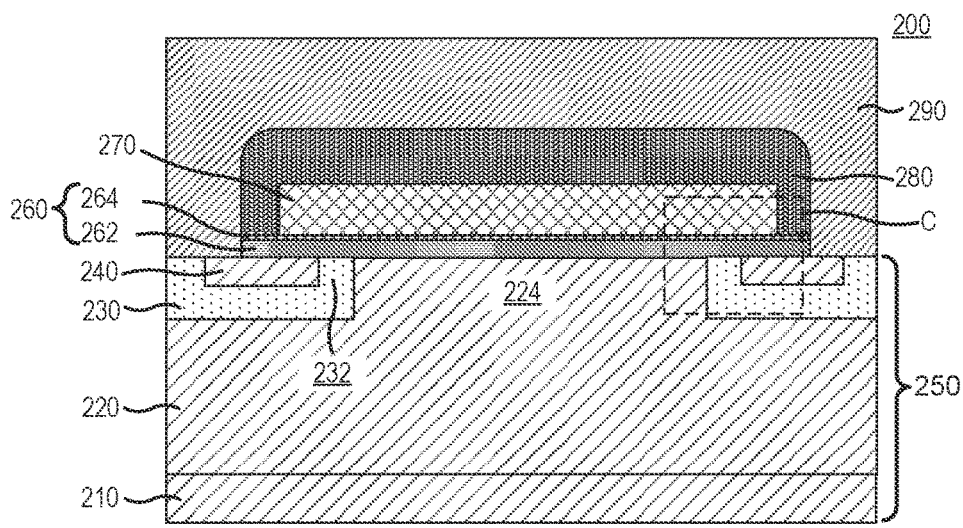
FIG. 4 is a schematic cross-sectional view of a unit cell of a silicon carbide MOSFET according to embodiments of the present invention.

FIG. 4 is a schematic cross-sectional view of a unit cell of a MOSFET 200 according to embodiments of the present invention. As shown in FIG. 4, the MOSFET 200 includes an n-type silicon carbide semiconductor substrate 210. The substrate 210 may comprise, for example, a single crystal 4H silicon carbide semiconductor substrate that is heavily-doped with n-type impurities (i.e., an n+ silicon carbide substrate). A lightly-doped n-type (n−) silicon carbide drift layer 220 is provided on the substrate 210. Upper portions of the n-type silicon carbide drift layer 220 may be doped p-type by, for example, ion implantation, to form silicon carbide p-wells 230. Heavily-doped (n+) n-type silicon carbide regions 240 may be formed in upper portions of the silicon carbide p-wells 230. The n-type regions 240 may be formed by ion implantation. The heavily-doped (n+) n-type silicon carbide regions 240 act as source regions for the device 200. The drift layer 220 and the substrate 210 together act as a common drain region for the device 200. The n-type substrate 210, the n-type drift layer 220, the p-wells 230, and the n-type source regions 240 formed therein may together comprise a semiconductor layer structure 250 of the device 200.

A gate dielectric layer 260 may be formed on the upper surface of the semiconductor layer structure 250. The gate dielectric layer 260 can include a stable dielectric material with a bandgap approximately 2 eV (or more) larger than the semiconductor underneath. The gate dielectric layer 260 includes at least a base dielectric layer 262 and a capping dielectric layer 264. The base gate dielectric layer 262 may comprise, for example, a silicon oxide ($SiO_2$) layer. The capping gate dielectric layer 264 may comprise a dielectric material having a dielectric constant that is higher than the dielectric constant of silicon oxide. For example, the capping gate dielectric layer 264 may comprise a wide variety of high dielectric constant materials including tantalum-based, titanium-based, aluminum-based, zirconium-based, yttrium-based and hafnium-based materials. In some embodiments, the capping gate dielectric layer 264 may include silicon, at least one of tantalum, titanium, aluminum, zirconium, yttrium or hafnium, and at least one of oxygen or nitrogen. For example, silicon-hafnium oxynitride may be used in an example embodiment. Other suitable materials for the capping gate dielectric layer 264 include silicate ($Si_xMetal_yO_z$) compounds or Silicon-Metal oxynitride compounds. Lanthanum or lanthanides may also be the metals in the silicates or oxynitride compounds. Simple oxide compounds such as MgO or $Al_2O_3$ may be suitable, as well as simple nitrides such as AlN. In some embodiments, the capping gate dielectric layer 264 may include silicon, a metal, and at least one of oxygen or nitrogen. In some embodiments, the capping gate dielectric layer 264 may include silicon, a metal, and both oxygen and nitrogen. It will be appreciated that the gate dielectric layers described herein (including the sub-layers thereof) are typically implemented as patterned layers that are formed by blanket depositing one or more dielectric layers and then later patterning those layer(s).

While the example embodiments of the present invention that are discussed below primarily focus on examples where the base gate dielectric layer comprises a silicon oxide layer, it will be appreciated that embodiments of the present invention are not limited thereto. For example, the base gate dielectric layer may be formed of another dielectric material (e.g., silicon nitride, silicon oxynitride, etc.) or may comprise a multilayer structure (e.g., a silicon oxide layer and a silicon oxynitride layer). Likewise, the capping gate dielectric layer may be a multilayer structure (e.g., having two or three different high dielectric constant material layers or a combination of low and high dielectric constant layers) and/or more than one capping gate dielectric layer may be provided. An example of a device having first and second capping gate dielectric layers is discussed below with reference to FIG. 11.

A gate electrode 270 is formed on the gate dielectric layer 260 opposite the semiconductor layer structure 250. The gate electrode 270 may include, for example, a silicide (e.g., NiSi, TiSi, WSi, CoSi), doped polycrystalline silicon (poly-Si), and/or a stable conductor. Other suitable materials for the gate electrode include various metals such as Ti, Ta or W or metal nitrides such as TiN, TaN or WN. A channel region 232 is provided in the upper portion of p-well 230 between the source region 240 and a so-called "JFET" portion 224 of the drift layer 220 that is directly underneath the gate dielectric layer 260.

A dielectric isolation pattern 280 is formed on the gate dielectric layer 260 and the gate electrode 270, and source metallization 290 is formed on the dielectric isolation pattern 280 and on the exposed portions of the semiconductor layer structure 250. A drain contact (not shown) may be provided on the lower surface of the substrate 210 opposite the drift layer 220.

The semiconductor layer structure 250 of FIG. 4 is merely an example, and other configurations of the semiconductor layer structure 250 may be used without deviating from the embodiments described herein. For example, the semiconductor layer structure 250 may include additional layers or regions such as, for example, a more heavily doped current spreading layer/region in the upper portion of the drift region 220 (e.g., in the JFET regions 224). It will also be appreciated that the embodiments described herein may be utilized in any gate-controlled semiconductor devices that use a metal-oxide and/or metal-insulator interface, such as MISFETs, IGBT devices and gate-controlled thyristors, to name a few. Thus, it will be understood that the semiconductor layer structure 250 can take multiple other forms without deviating from the embodiments described herein.

It will be appreciated that the above description is of an n-type MOSFET. In p-type devices, the locations of the source and drain contacts may be reversed, and the conductivity types of the other n- and p-type regions may be swapped. All of the embodiments disclosed herein may be implemented either as n-type or as p-type devices.

As discussed above, the base gate dielectric layer may be substantially thicker than the capping gate dielectric layer. In example embodiments, the base gate dielectric layer may be substantially thicker than the capping gate dielectric layer may be at least twice, three times, four times or five times thicker than the capping gate dielectric layer. Conventional silicon carbide based power semiconductor devices such as power MOSFETs, IGBTs and have relatively thick silicon oxide gate dielectric layers. Typical thicknesses may be on the order of 35-60 nm, for example. The power semiconductor devices according to embodiments of the present invention may have gate dielectric layers having similar thicknesses, or potentially even thicker gate dielectric layers.

Generally speaking, the equivalent electrical oxide thickness of the gate dielectric layer for a power semiconductor device may be selected based on desired performance criteria for the device. Thus, if a conventional power semiconductor device is to be modified to have a multilayer gate dielectric layer according to embodiments of the present invention, then the multilayer gate dielectric layer may be designed to have a gate dielectric layer having a ratio of thickness to dielectric constant (T/Dk) that is approximately the same as the T/Dk ratio of the power semiconductor device that is being modified. Thus, a portion of the silicon oxide gate dielectric layer of the conventional device may be omitted, and replaced with a capping gate dielectric layer that has a higher dielectric constant. The thickness of the capping gate dielectric layer may be thicker than the thickness of the omitted portion of the conventional gate dielectric layer by a factor equal to the ratio of the dielectric constant of the high dielectric constant material used in the capping gate dielectric layer to the dielectric constant of silicon oxide (about 3.9).

For example, assume that a conventional power semiconductor device having a silicon oxide gate dielectric layer with a thickness of 36 nm is to be modified to have a multilayer gate dielectric layer according to embodiments of the present invention. In this example, 5% of the silicon oxide gate dielectric layer is to be replaced with hafnium oxide. Thus, 1.6 nm of the 36 nm silicon oxide gate dielectric layer of the conventional device will be replaced with a hafnium oxide gate dielectric layer, leaving a 34.4 nm silicon oxide base gate dielectric layer. Hafnium oxide has a dielectric constant of about 20, which is about five times higher than the 3.9 dielectric constant of silicon oxide. Thus, an 8 nm hafnium oxide capping gate dielectric layer may be added to replace the omitted 1.6 nm of silicon oxide while (generally) maintaining the same electrical performance.

As the above example makes clear, the ratio of the thickness of the base gate dielectric layer to the thickness of the capping gate dielectric layer may depend upon the dielectric constant of the capping gate dielectric layer as compared to the dielectric constant of the base gate dielectric layer (which typically will be 3.9 since silicon oxide is typically used). Accordingly, reference will be made to herein to the "equivalent thicknesses" of the base and capping gate dielectric layers, where the "equivalent thickness" is the thickness of the layer divided by the dielectric constant of the material forming the layer. Thus, in the above example, the equivalent thickness of the base gate dielectric layer is 34.4 nm/3.9=8.82 nm. Similarly, the equivalent thickness of the capping gate dielectric layer is 8 nm/20=0.4 nm. Thus, the ratio of the equivalent thickness of the base gate dielectric layer to the equivalent thickness of the capping gate dielectric layer is 22.05 in this example. In example embodiments of the present invention, the ratio of the equivalent thickness of the base gate dielectric layer to the equivalent thickness of the capping gate dielectric layer may be at least 5, at least 10, at least 15, at least 20 o at least 25.

Note that herein the "thickness" of a gate dielectric layer refers to the extent of the gate dielectric layer in a direction that is perpendicular to the underlying surface on which the gate dielectric layer is formed. Thus, in the example of FIG. 4 described above, the thickness is measured in the vertical direction in FIG. 4 (i.e., in a direction that is perpendicular to an upper surface of the semiconductor layer structure 250). In a power semiconductor device having a gate trench, such as the power semiconductor devices of FIGS. 10 and 11 herein, the thickness of the gate dielectric layer is measured in the vertical direction for portions of the gate dielectric layer that are on upper surfaces of the semiconductor layer structure, while the thickness is measured in the horizontal direction for portions of the gate dielectric layer that are on sidewalls of the trench.

As described above, the capping gate dielectric layer 264 may be formed of a material that has etching selectivity with respect to silicon oxide. As such, the capping gate dielectric layer 264 may acts as an etch stop pattern during an etching step that is used to pattern a gate electrode layer to form the gate electrode 270. Over-etching of the gate electrode of power MOSFETs that results in damage to the gate dielectric layer is a significant cause of device failure in power MOSFETs.

The high dielectric constant capping gate dielectric layer 264 may be formed of a material that acts as an etch stop layer during the etching of the gate electrode layer to form the gate electrode 270 of the MOSFET 200. In particular, most high dielectric constant materials that may be used in the capping gate dielectric layer 264 are chemically quite different from silicon and hence etchants are readily available that will readily etch the polysilicon gate electrode layer that do not etch these high dielectric constant gate dielectric materials. The multilayer gate dielectric layers 264 according to embodiments of the present invention may thus reduce or eliminate such over-etching and resultant device failure.

While the multilayer gate dielectric layer 260 may protect against over-etching, one unfortunate consequence of reducing the thickness of the silicon oxide base gate dielectric layer 262 (as compared to the thickness of silicon oxide gate dielectric layer 160 of a comparable conventional device) is that the reduction in thickness acts to generally increase the electric field values in the parallel plate region of the base gate dielectric layer 262 during on-state operation of the device. As such, using a relatively thick capping gate dielectric layer 264—and hence a thinner silicon oxide base gate dielectric layer 262—may act to shorten the lifetime of the gate dielectric layer 260 due to the increased electric fields in the gate dielectric layer 260. Thus, pursuant to embodiments of the present invention, relatively thin capping gate dielectric layers 264 may be used to reduce or minimize the reduction on the thickness of the silicon oxide base gate dielectric layer 262 so that any increase in the electric field values will be small. Thus, for example, in the specific embodiment discussed above, a 36 nm conventional silicon oxide gate dielectric layer 160 was replaced with a 34.4 nm silicon oxide base gate dielectric layer 262 (i.e., 1.6 nm of silicon oxide was omitted) and was replaced with an 8 nm thick hafnium oxide capping gate dielectric layer 264. Here, the base gate dielectric layer 262 is more than four times thicker than the capping gate dielectric layer 264. If a material having a higher dielectric constant than hafnium oxide is used for the capping gate dielectric layer 264, then the thickness ratio may decrease (since the capping gate dielectric layer 264 may be made thicker than 8 nm), whereas if a material having a lower dielectric constant than hafnium oxide is used for the capping gate dielectric layer 264, then the thickness ratio may increase (since the capping gate dielectric layer 264 will need to be less than 8 nm to maintain the same capacitor charge across the gate dielectric layer 260).

Figure 5A:
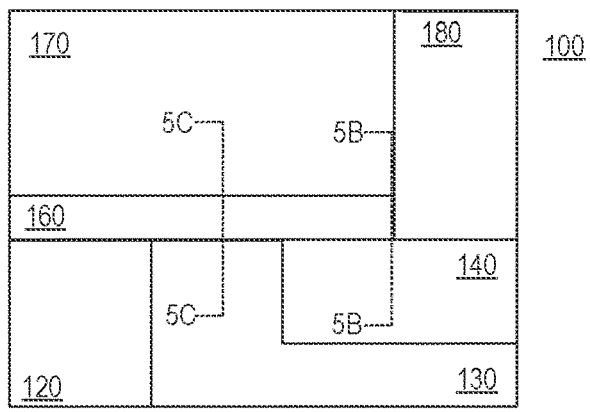
FIG. 5A is an enlarged cross-sectional view of a portion of the conventional silicon carbide MOSFET of FIG. 2.
Figure 5B:
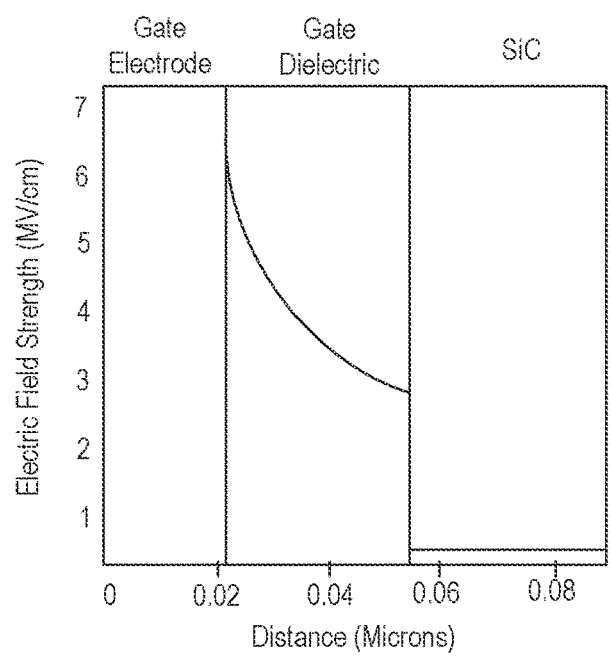
FIG. 5B is a graph showing the simulated electric field strength along the line 5B-5B of the conventional silicon carbide MOSFET of FIG. 5A during on-state operation.
Figure 5C:
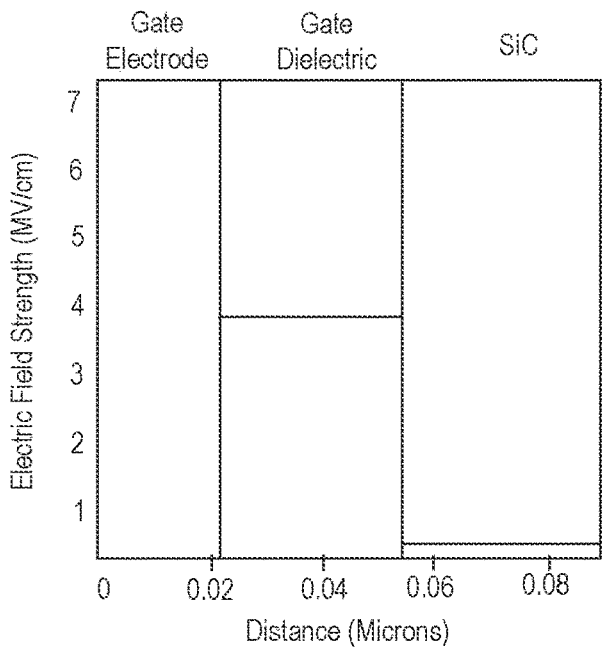
FIG. 5C is a graph showing the simulated electric field strength along the line 5C-5C of the conventional silicon carbide MOSFET of FIG. 5A during on-state operation.
Figure 6A:
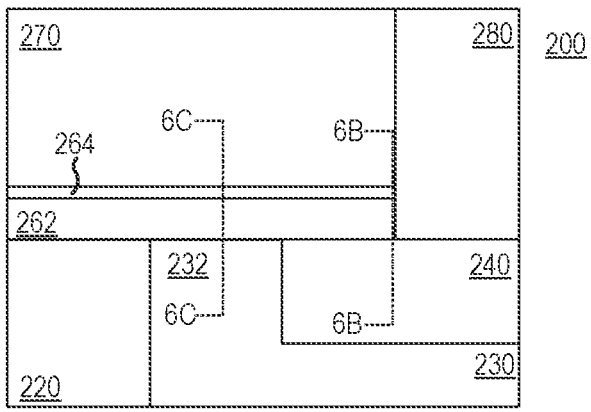
FIG. 6A is an enlarged cross-sectional view of a portion C of a silicon carbide MOSFET according to embodiments of the present invention of FIG. 4.
Figure 6B:
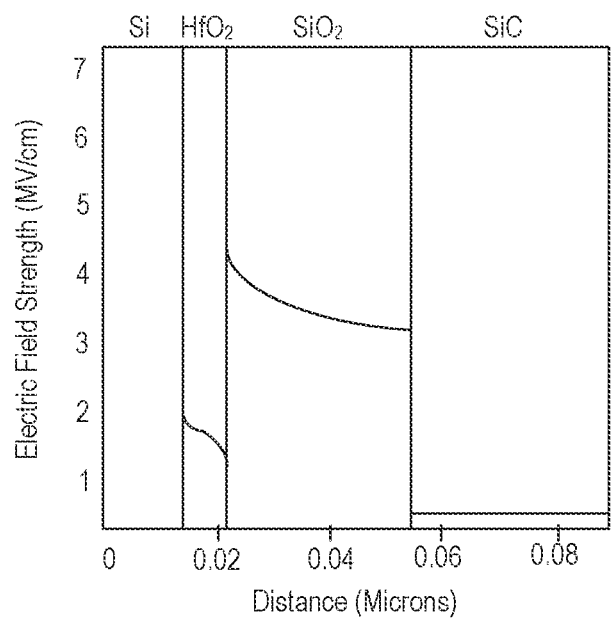
FIG. 6B is a graph showing the simulated electric field strength along the line 6B-6B of the silicon carbide MOSFET of FIG. 6A during on-state operation.
Figure 6C:
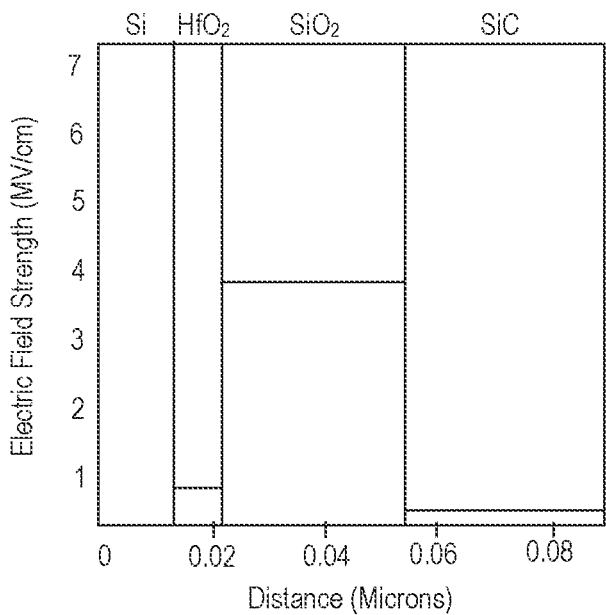
FIG. 6C is a graph showing the simulated electric field strength along the line 6C-6C of the silicon carbide MOSFET of FIG. 6A during on-state operation.

One significant advantage of the multilayer gate dielectric layers according to embodiments of the present invention such as gate dielectric layer 260 is that the electric field values in the capping gate dielectric layer 264 will be lower than the corresponding electric field values that would be present in a silicon oxide gate dielectric layer due to the higher dielectric constant material used in the capping gate dielectric layer 264. The higher dielectric constant of the material of the capping gate dielectric layer 264 may significantly reduce electric field crowding effects underneath the corner of the gate electrode 270, thereby reducing or even almost eliminating the gate edge field peaking that otherwise will occur. This can be seen by with reference to FIGS. 5A-5C and 6A-6C. In particular, FIG. 5A is an enlarged cross-sectional view of a portion "A" of the conventional silicon carbide MOSFET 100 of FIG. 2. FIGS. 5B and 5C are graphs showing the simulated electric field strength along the lines 5B-5B (the corner region) and 5C-5C (the parallel plate region) of FIG. 5A during on-state operation. Similarly, FIG. 6A is an enlarged cross-sectional view of a portion "C" of the silicon carbide MOSFET 200 according to embodiments of the present invention of FIG. 4. FIGS. 6B and 6C are graphs showing the simulated electric field strength along the lines 6B-6B (the corner region) and 6C-6C (the parallel plate region) of FIG. 6A during on-state operation. The only difference between the devices of FIGS. 5A and 6A is that the top 1.6 nm of the silicon oxide gate dielectric layer of the device of FIG. 5A is replaced with 8 nm of hafnium oxide in the device of FIG. 6A. In the simulations used to generate the graphs of FIGS. 5b-5C and 6B-6C, the gate-to-source bias voltage was 15 volts.

As can be seen by comparing FIGS. 5B and 6B, the simulated peak electric field value in the hafnium oxide capping gate dielectric layer 264 is only about $2 \times 10^6$ volts/cm (FIG. 6B), whereas the peak electric field strength in the silicon oxide gate dielectric layer 160 of the conventional device is about $6.5 \times 10^6$ volts/cm (FIG. 5B). Thus, in the power semiconductor devices according to embodiments of the present invention, the peak electric field strength occurs in the corner region of the device at the top surface of the silicon oxide base gate dielectric layer 262. As shown in FIG. 6B, this peak electric field value is about $4.3 \times 10^6$ volts/cm, which is more than one-third lower than the peak electric field value ($6.5 \times 10^6$ volts/cm) in the conventional MOSFET 100 (see FIG. 5B). Thus, the location where the peak electric field occurs is moved downwardly by a distance corresponding to the thickness of the capping gate dielectric layer 264, and the maximum value of the electric field may be significantly reduced. This can significantly enhance the lifetime of the device by delaying dielectric breakdown.

FIGS. 5C and 6C show the electric field values in the parallel plate regions of MOSFETS 100 and 200, respectively. As shown, in each case the electric field strength in the silicon oxide portion of the gate dielectric layer 160/262 is substantially constant as a function of depth with a value of about $4 \times 10^6$ volts/cm (i.e., the electric field strength in the parallel plate portion of the gate dielectric layers are basically identical). In the MOSFET 200, the electric field strength in the hafnium oxide portion of the gate dielectric layer 264 is substantially constant as a function of depth with a value of about $1 \times 10^6$ volts/cm, which is about four times lower than the fields in the silicon oxide portion of the gate dielectric layer.

Figure 7:
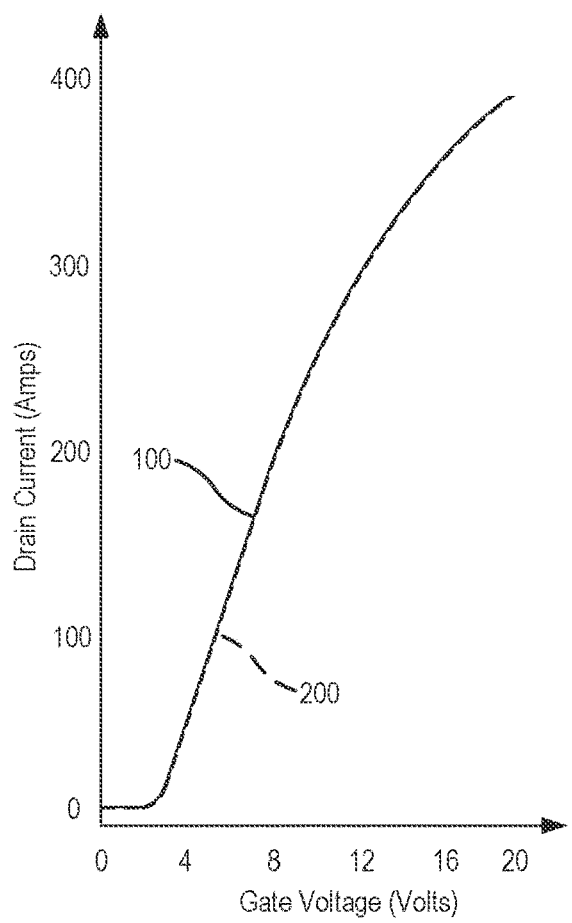
FIG. 7 is a graph showing the simulated drain current to gate voltage response for the conventional silicon carbide MOSFET of FIG. 5A and the silicon carbide MOSFET according to embodiments of the present invention of FIG. 6A.

It typically is desirable that the multilayer gate dielectric layers included in the power semiconductor devices according to embodiments of the present invention exhibit similar resistance so that the on-state current level is maintained. FIG. 7 is a graph showing the simulated drain current to gate voltage response for both the conventional power MOSFET 100 of FIG. 2 and for the power MOSFET 200 according to embodiments of the present invention of FIG. 4. As can be seen, the drain current during on-state operation is essentially identical. This shows that the techniques disclosed herein do not degrade other performance characteristics of the device.

Figure 8:
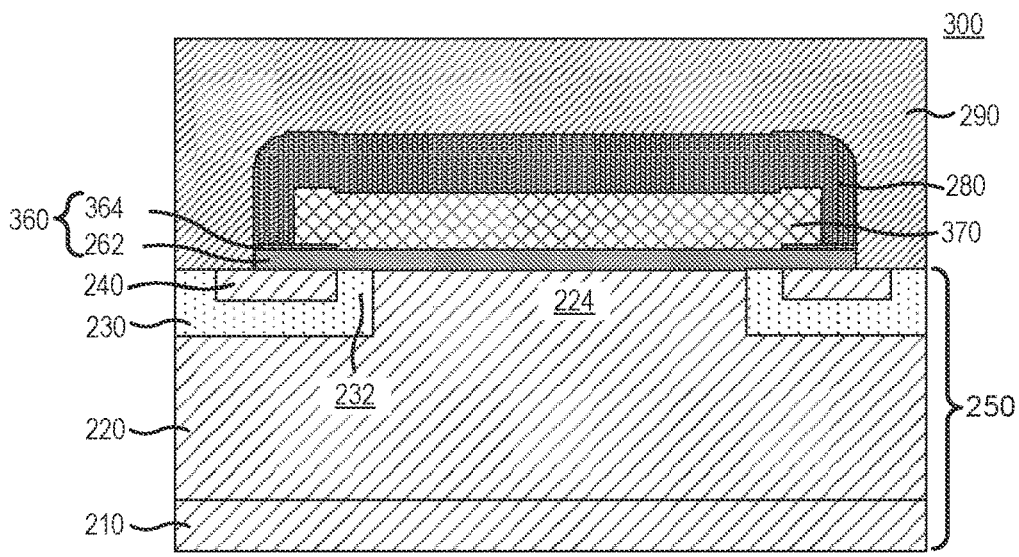
FIG. 8 is a schematic cross-sectional view of a silicon carbide MOSFET according to further embodiments of the present invention.

FIG. 8 is a schematic cross-sectional view of a power MOSFET 300 according to further embodiments of the present invention. The power MOSFET 300 is includes a substrate 210, a drift layer 220 (including JFET region 224), p-wells 230 (including channel regions 232), source regions 240 (i.e., a semiconductor layer structure 250), a base gate dielectric layer 262 and source metallization 290 that may be identical to the like-numbered elements of MOSFET 200. Accordingly further description thereof will be omitted. However, the MOSFET 300 includes a capping gate dielectric layer 364, a gate electrode 370 and a dielectric isolation pattern 380 that differ from their similarly numbered counterpart elements in the MOSFET 200.

In particular, as shown in FIG. 8, the capping gate dielectric layer 364 is only formed on a portion of the base gate dielectric layer 262. In the depicted embodiment, the capping gate dielectric layer 364 is only formed above the source regions 240, although embodiments of the present invention are not limited thereto. Notably, the capping gate dielectric layer 364 is not formed over the JFET region 224. As a result, the capping gate dielectric layer 364 may have even less of an effect on the on-state resistance of the MOSFET 300 (as compared to the MOSFET 200 discussed above), which means that even thicker capping gate dielectric layers 364 may potentially be used, which can increase the effectiveness of the capping gate dielectric layer 364 as an etch stop layer during the etching of the gate electrode layer. It may also allow for use of materials in the capping gate dielectric layer 364 that may have adverse effects on the channel region 232, since the capping gate dielectric layer 364 is not disposed above the channel regions 232.

In some embodiments, the capping gate dielectric layer 364 may not extend over the portions of the p-wells 230 that contact the base gate dielectric layer 262 adjacent the JFET regions 224 (i.e., the portions of the p-wells 230 that act as the channel regions 232). Typically, performance of a vertical MOSFET may be improved if the thickness of the portion of the gate dielectric layer that is between the gate electrode and the channel region is substantially constant. By only forming the capping gate dielectric layer 364 on the source regions 240, the gate dielectric layer 360 may have a constant thickness above the channel regions 232.

As can be seen in FIG. 8, the gate dielectric layer 360 has a stepped upper surface since the capping gate dielectric layer 364 is only formed on a portion of the base gate dielectric layer 262. In particular, the capping gate dielectric layer 364 is only formed on the source regions 240 and the outer portions of the p-wells 230 and is not formed on the upper surface of the JFET region 224 (i.e., the portion of the drift layer 220 that directly contacts the base gate dielectric layer 262) or above the channel regions 232. Since the gate dielectric layer 360 has a stepped upper surface, the gate electrode 370 has a stepped lower surface. The step in the lower surface of the gate electrode may result in the gate electrode 370, and potentially the dielectric isolation pattern 380, to also have stepped upper surfaces, as is also sown in FIG. 8. As shown, it is the opposed outer upper edges of the gate electrode 370 that are farther above the semiconductor layer structure 250 than is the central portion of the upper surface of the gate electrode 370.

Since the capping gate dielectric layer 364 covers the portions of the base gate dielectric layer 262 that extends laterally beyond the gate electrode 370, it may serve as an etch stop layer to protect the base gate dielectric layer 262 from over-etching during an etching step used to form the gate electrode 370. Moreover, since the high dielectric constant capping gate dielectric layer 364 is interposed between the base gate dielectric layer 262 and the outer sidewalls of the gate electrode 370, it may reduce the peak electric field values in the gate dielectric layer 360. Since the capping gate dielectric layer 364 is not interposed between the gate electrode 370 and the channel regions 232 and/or JFET region 224, it may have even reduced impact on the performance of the power MOSFET 300.

FIGS. 9A through 9D schematic cross-sectional views illustrating process steps that may be used to fabricate the MOSFET 300 of FIG. 8.

Figure 9A:
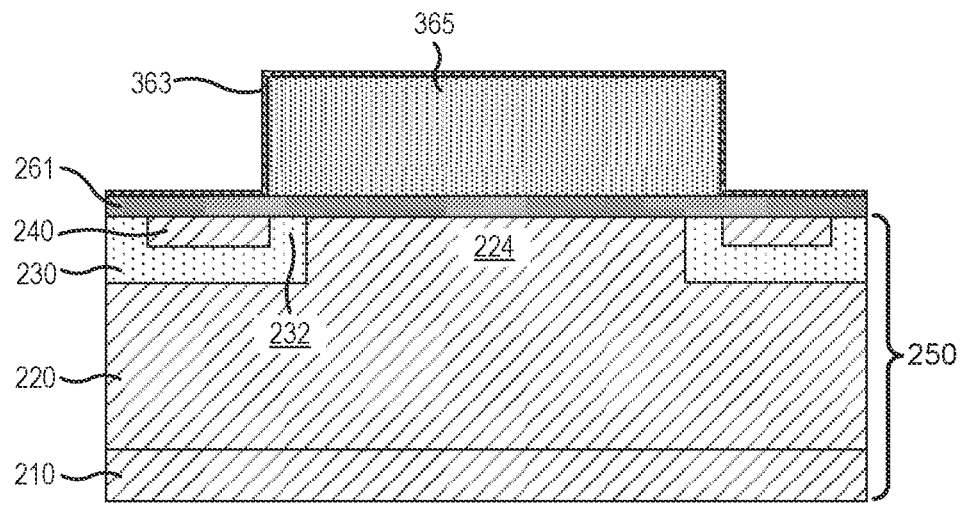
FIGS. 9A-9D are schematic cross-sectional views illustrating a method for fabricating the silicon carbide MOSFET of FIG. 8.

Referring to FIG. 9A, the semiconductor layer structure 250 may be formed. For example, a heavily-doped (n$^+$) n-type silicon carbide substrate 210 is provided and a lightly-doped (n$^-$) silicon carbide drift layer 220 is formed on the substrate 210 via epitaxial growth. While not shown, in some embodiments, an n-type silicon carbide current spreading layer may be formed that comprises the upper portion of the drift layer 220. Silicon carbide p-wells 230 are formed in upper portions of the drift layer 220 by, for example, ion implantation. Heavily-doped (n$^+$) n-type silicon carbide source/drain regions 240 are then formed in upper portions of the p-wells 230 by, for example, ion implantation. A base gate dielectric layer 261 is then blanket formed on the device. The base gate dielectric layer 261 may comprise a silicon oxide layer.

A sacrificial mask 365 is then formed on the base gate dielectric layer 261 to cover a portion of the base gate dielectric layer 261 on which the capping gate dielectric layer 364 will not be formed. The sacrificial mask 365 may comprise, for example, photoresist or hard mask material. As shown in FIG. 9A, the sacrificial mask 365 may cover the portions of the base gate dielectric layer 261 that are above the JFET region 224 and the channel regions 232. Next a capping gate dielectric layer 363 is blanket formed on the base gate dielectric layer 261 and the sacrificial mask 365. As shown, in some embodiments the capping gate dielectric layer 363 may be thinner than the base gate dielectric layer 261. In example embodiments, a thickness of the base gate dielectric layer 261 may be at least two times, three times, four times or five times a thickness of the capping gate dielectric layer 363.

Figure 9B:
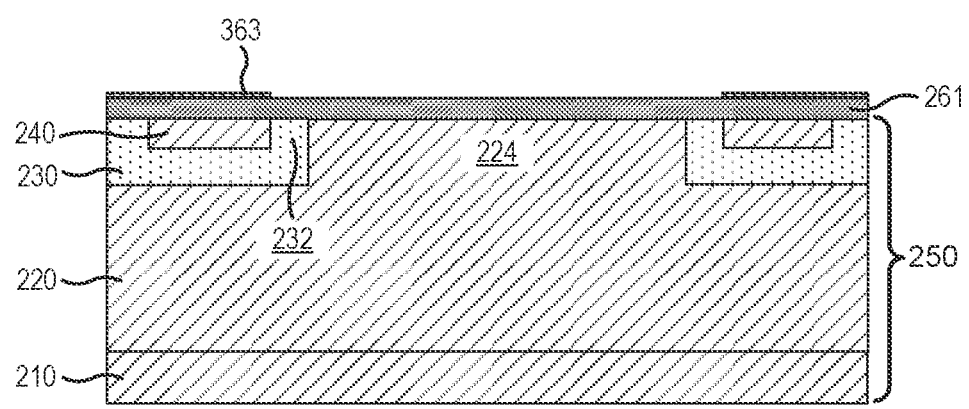

Referring to FIG. 9B, an etching mask (not shown) may be formed that covers the portions of on the capping gate dielectric layer 363 that directly contact the base gate dielectric layer 261, while the portion of the capping gate dielectric layer 363 that directly contacts the sacrificial mask 365 is left exposed. An etching process may then be performed that removes the portions of the capping gate dielectric layer 363 that directly contact the sacrificial mask 365 as well as the sacrificial mask 365. As a result, the capping gate dielectric layer 363 is only left on the portions of the base gate dielectric layer 261 that are above the source regions 240 and the outer portions of the p-wells 230.

Figure 9C:
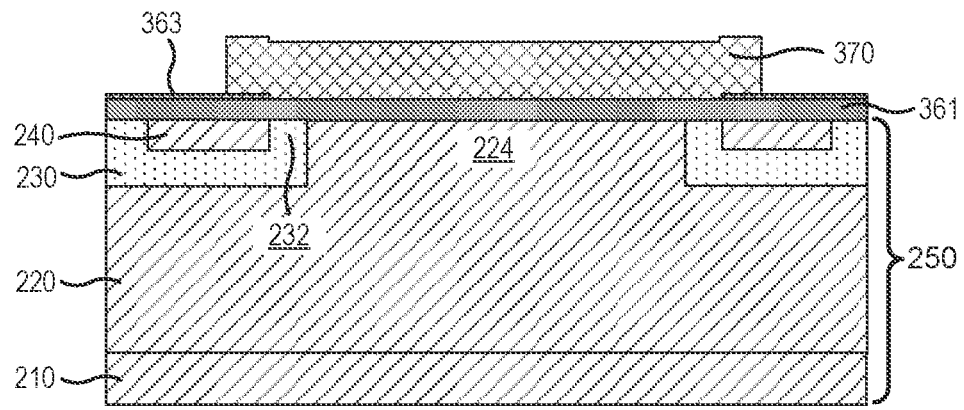

Referring to FIG. 9C, a gate electrode layer (not shown) may be blanket formed over the top surface of the device. The gate electrode layer may then be etched using standard techniques to form the gate electrode 370. As shown in FIG. 9C, the gate electrode 370 may have a stepped lower surface and a stepped upper surface because outer side portions of the gate electrode 370 extend onto the capping gate dielectric layer 363.

Figure 9D:
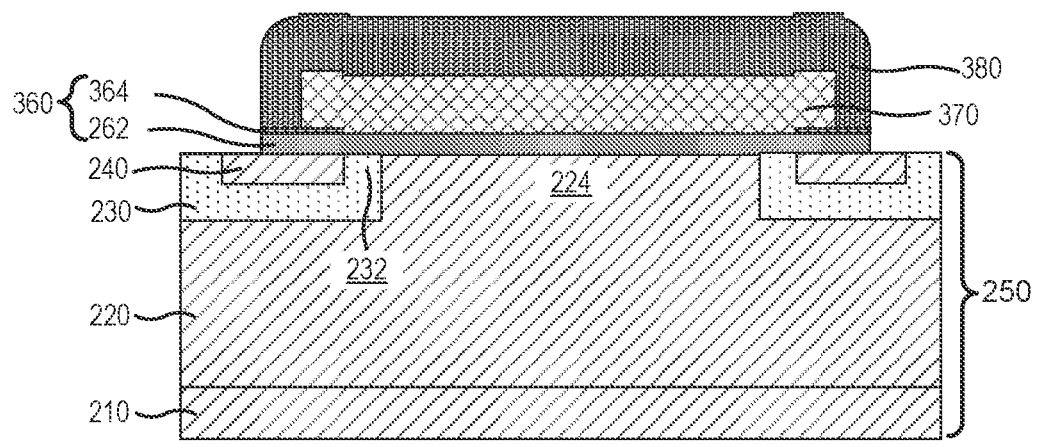

Referring to FIG. 9D, a dielectric isolation layer (not shown) is formed that may comprise for example, a multilayer or single layer dielectric layer. In an example embodiment, the dielectric isolation layer may comprise a multilayer structure including silicon oxide and phosphorous silicate glass. The dielectric isolation layer is then patterned to expose the source regions 240 to form the dielectric isolation pattern 380. Finally, source metallization 290 may then be formed to cover the dielectric isolation pattern 380 and to contact the source regions 240 to provide the MOSFET 300, as shown in FIG. 8.

Note that in some embodiments of the present invention, the gate dielectric layer may be patterned separately from the patterning of the gate electrode. As a result, the gate dielectric layer may extend laterally beyond the sidewalls of the gate electrode. This may be advantageous since the gate dielectric layer may comprise a high quality dielectric material as compared to the dielectric isolation pattern that is used to cover the gate electrode. Having the gate dielectric layer extend laterally beyond the sidewalls of the gate electrode thus may ensure that the portion of the gate dielectric layer that are above the source regions comprise high quality dielectric materials that are less susceptible to breakdown. In some embodiments, the gate dielectric layer may extend laterally beyond the sidewalls of the gate electrode the same distance that the dielectric isolation pattern extends laterally beyond the sidewalls of the gate electrode.

Figure 10:
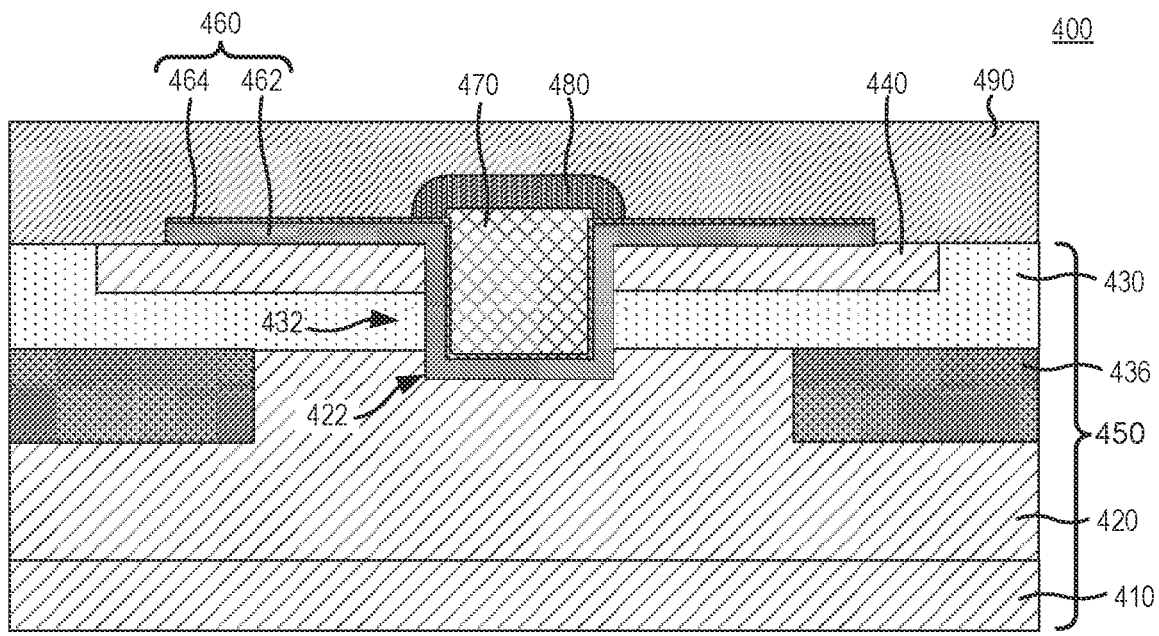
FIG. 10 is a schematic cross-sectional view of a silicon carbide MOSFET according to additional embodiments of the present invention.

FIG. 10 is a schematic cross-sectional view of a MOSFET 400 according to further embodiments of the present invention that has a gate electrode that is formed within a trench in the semiconductor layer structure thereof. MOSFETs that have a gate trench are commonly referred to as U-Shaped MOSFET (UMOSFET) devices.

As shown in FIG. 10, the MOSFET 400 includes a semiconductor layer structure 450 that includes a heavily-doped n-type silicon carbide semiconductor substrate 410, a lightly-doped n-type (n−) silicon carbide drift layer 420, silicon carbide p-type wells 430 and heavily-doped (n+) n-type silicon carbide source regions 440. A trench 422 is provided in the drift layer 420. In some embodiments, a bottom surface of the trench 422 may extend into the drift layer 420 below a bottom surface of the wells 430 and/or the source regions 440. The substrate 410, drift layer 420, well 430, and source regions 440 may be substantially identical to the corresponding regions/layers of MOSFET 200 of FIG. 4, with two exceptions. First, as described above, a trench 422 is provided in the upper surface of the drift layer 420. Second, p-type shield regions 436 may be formed in the drift layer 420. The shield regions 436 may help protect the corners of the final gate dielectric layer 460 from high electric fields during reverse blocking operation. Thus, further discussion of the semiconductor layer structure 450 will be omitted.

As is further shown in FIG. 10, a multilayer gate dielectric layer 460 is provided on the bottom surface and sidewalls of the trench 422 and on the source regions 440. The multilayer gate dielectric layer 460 includes a base gate dielectric layer 462, which may comprise a silicon oxide layer, and a capping gate dielectric layer 464, which may comprise a material having a dielectric constant that is higher than the dielectric constant of silicon oxide. The multilayer gate dielectric layer 460 may be identical to any of the above-described multilayer gate dielectric layers according to embodiments of the present invention, except that instead of being a planar layer the multilayer gate dielectric layer 460 has portions that extend along the sidewalls and bottom surface of the trench 422.

A gate electrode 470 is formed within the trench 422, and a dielectric isolation pattern 480 covers the gate electrode 470. Source metallization 490 is formed on the semiconductor layer structure, gate dielectric layer 460 and dielectric isolation pattern 480 in order to complete the device.

As in the above-described embodiments, the capping gate dielectric layer 464 acts as an etch stop pattern that may protect the underlying base gate dielectric layer from damage during the etching step that is performed to form the gate electrode 470. This may be important because the highest electric fields may occur in the portions of the gate dielectric layer 460 that are adjacent the upper sidewalls of the trench 422.

Figure 11:
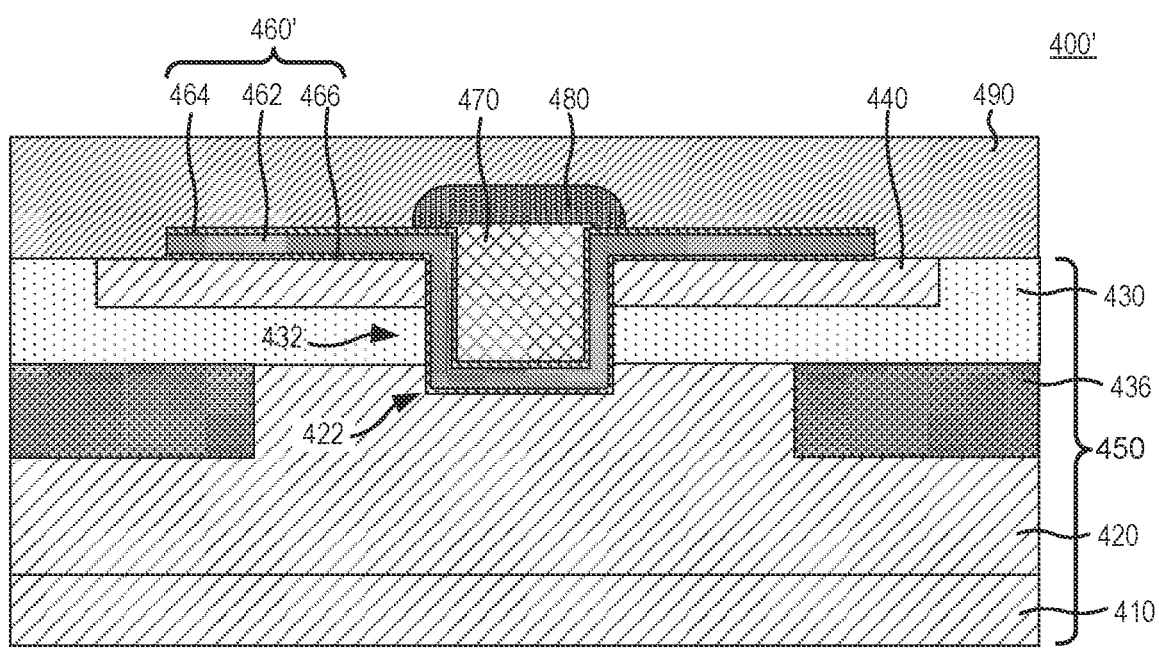
FIG. 11 is a schematic cross-sectional view of a modified version of the silicon carbide MOSFET of FIG. 10.

The highest electric field values in the gate dielectric layer 460 of the MOSFET 400 during on-state operation may occur at the "inside" corners of the gate dielectric layer 460, which correspond to the upper corners of the trench 422 (i.e., the highest fields occur in the portions of the gate dielectric layer 460 that contacts the upper corners of the trench 422). Notably, the capping gate dielectric layer 464 is not present in this region of the gate dielectric layer, so that the high fields may occur in the silicon oxide base gate dielectric layer 462. FIG. 11 is a schematic cross-sectional view of a MOSFET 400' that is a modified version of the MOSFET 400 that includes a gate dielectric layer 460' having a second capping gate dielectric layer 466 that helps reduce the peak electric field adjacent the insider corners of the gate dielectric layer 460'.

As shown in FIG. 11, the MOSFET 400' may be identical to the MOSFET 400, except that a three-layer gate dielectric layer is provided that includes a silicon oxide base gate dielectric layer 462 as well as first and second high dielectric constant capping gate dielectric layers 464, 466 that are formed on opposed surfaces of the base gate dielectric layer 462. Since the capping gate dielectric layer 466 is formed of a high dielectric constant material, the electric fields in this layer during on-state operation will be less than the electric fields that would be present in the silicon oxide base gate dielectric layer 462. As such, while electric field crowding effects may still be present in the gate dielectric layer 460' around the upper corners of the trench 422, the electric fields directly adjacent to the trench corners will be lower because of the higher dielectric constant of the capping gate dielectric layer 466. Thus, the same type of reduction in the peak electric field values that is discussed above with reference to FIG. 6B may be achieved in the MOSFET 400'.

A potential difficulty with the MOSFET 400' of FIG. 11 is that if the fabrication process includes high temperature processing steps after the formation of the gate dielectric layer 460' then silicon oxide may grow at the interface between the silicon carbide semiconductor layer structure 450 and the gate dielectric layer 460'. Since any such silicon oxide layer would be very thin, it would have very high electric fields therein during device operation, and hence would be highly susceptible to breakdown. Additionally, the quality of the interface between many high dielectric constant materials and silicon carbide may be poor. Thus, care must be taken in the choice of the material for the capping dielectric layer 466 and the temperature levels of subsequent processing steps to ensure that the addition of the capping gate dielectric layer 466 does not significantly negatively affect the performance of the MOSFET 400'.

Pursuant to further embodiments of the present invention, trench semiconductor devices are provided that include trenches having rounded corners. The lower corners and/or the upper corners of the trench may be rounded. Techniques for rounding the corners according to further embodiments of the present invention will be discussed with reference to FIG. 12, which is a schematic cross-sectional view of a trench according to embodiments of the present invention.

Figure 12:
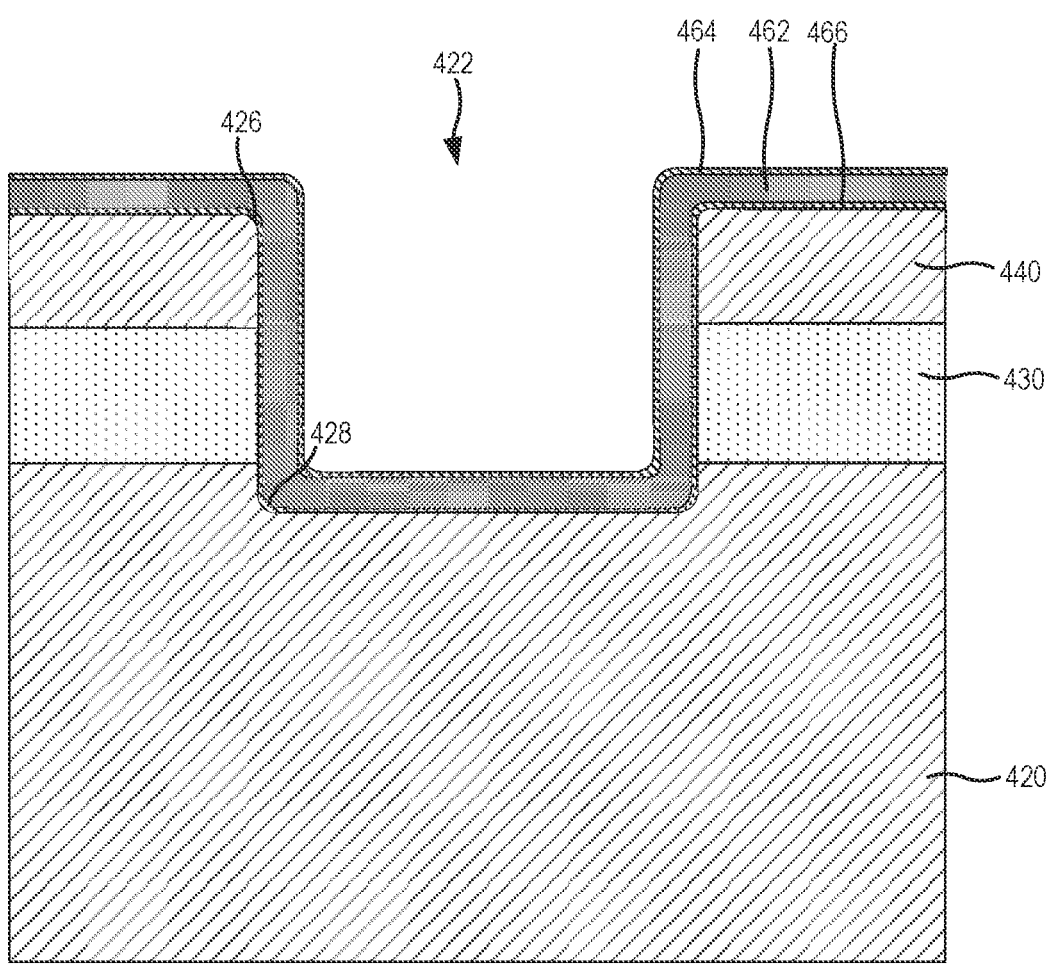
FIG. 12 is a schematic cross-sectional view of the gate trench region of MOSFETs according to embodiments of the present invention illustrating how the corners of the gate trench may be rounded.

As shown in FIG. 12, the trench 422 has upper corners 426 and lower corners 428. These corners may be rounded, as shown in FIG. 12, using various techniques. For example, after formation of the trench 422, a post process anneal is performed in a hydrogen environment that etches the exposed silicon carbide. Since both the top surface and the side surface of each upper corner 426 is exposed to the hydrogen, the upper corner etches away at a faster rate than the other planar exposed silicon carbide surfaces. Moreover, the upper surface and sidewall of the trench comprise different planes (i.e., different atomic arrangements) of the silicon carbide material, and the bulk silicon carbide material may be oriented so that the sidewalls comprise a plane that etches faster in hydrogen than the upper surface. As a result, there may be significant rounding of the upper corners 426 as shown in FIG. 12, as well as some rounding of the lower corners 428. Subsequent to the hydrogen anneal/etch, surface cleaning may be performed on the silicon carbide structure, and this cleaning may also further round the upper and lower corners 426, 428 of the trench 422.

As is further shown in FIG. 12, the gate dielectric layer 460 may be formed conformally on the semiconductor layer structure. As a result, the rounding of the corners 426, 428 of trench 422 is replicated in the different layers 462, 464, 466 of the gate dielectric layer 460. This rounding reduces the electric field crowding effects, and hence may help reduce the peak electric field values in the gate dielectric layer 460 (or 460') during on-state operation of the device. The rounding of the portions of the gate dielectric layers 460, 460' that are adjacent the lower corners 428 of the trench may also help reduce the peak electric fields during reverse blocking operation.

It will be appreciated that the trench MOSFETs 400, 400' of FIGS. 10 and 11 may have rounded corners that are formed using the above-described techniques. It will also be appreciated that any conventional trench semiconductor device may be improved by rounding the corners of the trench in the above-described fashion. Thus, the rounded corners may be used with or separate from the multilayer gate dielectric layers according to embodiments of the present invention.

It will be appreciated that the trench 422 extends through a region of the semiconductor device (e.g., into the page in the view of FIG. 12), and hence the upper corners 426 refer to the regions where the opposed sidewalls of the trench 422 and the top surface of the semiconductor layer structure 450 meet or intersect, while the lower corners 428 refer to the regions where the opposed sidewalls of the trench 422 and the bottom surface of the trench 422 meet or intersect. Thus, it will be appreciated that the corners 426, 428 may refer to two-dimensional corners as opposed to three-dimensional corners that are present, for example in a cube.

While embodiments of the present invention have been discussed above primarily with respect to semiconductor devices that include silicon gate electrodes, it will be appreciated that embodiments of the present invention are not limited thereto. Thus, in other embodiments, other gate electrode materials may be used, including gate electrodes formed of other semiconductor materials, silicides and/or metals, for example. The oxidation and/or nitridation anneal techniques disclosed herein may be used to convert selected portions of these other gate electrodes into dielectric material.

The present disclosure describes an approach to improve interface protection in metal-oxide (or insulator)-semiconductor (MOS or MIS) devices. This may be particularly useful for improving the gate regions in a power transistor (e.g., a MOSFET, MISFET, or an IGBT).

While various of the embodiments discussed above illustrate the structure of a unit cell of an n-channel MOSFET, it will be appreciated that pursuant to further embodiments of the present invention, the polarity of each of the semiconductor layers in each device could be reversed so as to provide corresponding p-channel MOSFETs.

The invention has been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on," "connected to," or "coupled to" another element or layer, it can be directly on, connected or coupled to the other element or layer, or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

It will be understood that the embodiments disclosed herein can be combined. Thus, features that are pictured and/or described with respect to a first embodiment may likewise be included in a second embodiment, and vice versa.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A semiconductor device, comprising:
a semiconductor layer structure that comprises silicon carbide, the semiconductor layer structure comprising a source region and a trench formed in the semiconductor layer structure, where at least some corners of the trench are rounded;
a gate dielectric layer on a top surface of the source region and within the trench, the gate dielectric layer comprising lower corners and upper corners, where at least one of the lower corners and upper corners comprises a rounded corner;
a gate electrode on the gate dielectric layer opposite the semiconductor layer structure; and
a dielectric isolation pattern on the gate electrode and the gate dielectric layer,
wherein the gate dielectric layer extends laterally beyond sidewalls of the gate electrode and sidewalls of the dielectric isolation pattern.

2. The semiconductor device of claim 1, wherein the gate dielectric layer comprises a silicon oxide base gate dielectric layer and a capping gate dielectric layer on an upper surface of the silicon oxide base gate dielectric layer.

3. The semiconductor device of claim 2, wherein a ratio of a thickness of the silicon oxide base gate dielectric layer divided by a dielectric constant of a material of the silicon oxide base gate dielectric layer to a thickness of the capping gate dielectric layer divided by a dielectric constant of a material of the capping gate dielectric layer is at least ten.

4. The semiconductor device of claim 2, wherein a dielectric constant of the capping gate dielectric layer is at least three times more than a dielectric constant of the silicon oxide base gate dielectric layer.

5. The semiconductor device of claim 2, wherein the lower corners of the gate dielectric layer comprise rounded corners and the upper corners of the gate dielectric layer comprise rounded corners.

6. The semiconductor device of claim 2, wherein the corners of the gate dielectric layer that are rounded are lower corners of the gate dielectric layer.

7. The semiconductor device of claim 2, wherein the corners of the gate dielectric layer that are rounded are upper corners of the gate dielectric layer.

8. A semiconductor device, comprising:
a semiconductor layer structure that comprises silicon carbide, the semiconductor layer structure comprising a trench formed therein, where at least some corners of the trench are rounded;
a gate dielectric layer on the semiconductor layer structure-and within the trench, the gate dielectric layer comprising lower corners and upper corners, where at least one of the lower corners and upper corners comprises a rounded corner; and
a gate electrode on the gate dielectric layer opposite the semiconductor layer structure
wherein the gate dielectric layer comprises a silicon oxide base gate dielectric layer and a capping gate dielectric layer on an upper surface of the silicon oxide base gate dielectric layer,
wherein the semiconductor device is configured so that during on-state operation a peak electric field value in the silicon oxide base gate dielectric layer is at least 50% greater than a peak electric field value in the capping gate dielectric layer.

9. A semiconductor device, comprising:
a semiconductor layer structure that comprises silicon carbide, the semiconductor layer structure comprising a trench formed therein, where at least some corners of the trench are rounded;
a gate dielectric layer on the semiconductor layer structure-and within the trench, the gate dielectric layer comprising lower corners and upper corners, where at least one of the lower corners and upper corners comprises a rounded corner; and
a gate electrode on the gate dielectric layer opposite the semiconductor layer structure
wherein the gate dielectric layer comprises a silicon oxide base gate dielectric layer and first and second capping gate dielectric layers that are on respective lower and upper surfaces of the silicon oxide base gate dielectric layer, where the first and second capping gate dielectric layers each has a dielectric constant that is greater than a dielectric constant of the silicon oxide base gate dielectric layer.

10. A semiconductor device, comprising:
a semiconductor layer structure that comprises silicon carbide, the semiconductor layer structure comprising a trench formed therein, where at least some corners of the trench are rounded;
a gate dielectric layer on the semiconductor layer structure-and within the trench, the gate dielectric layer comprising lower corners and upper corners, where at least one of the lower corners and upper corners comprises a rounded corner; and
a gate electrode on the gate dielectric layer opposite the semiconductor layer structure
wherein the gate dielectric layer comprises a silicon oxide base gate dielectric layer and a capping gate dielectric layer on an upper surface of the silicon oxide base gate dielectric layer,
wherein the capping gate dielectric layer is thinner than the silicon oxide base gate dielectric layer.

11. A semiconductor device, comprising:
a semiconductor layer structure that comprises silicon carbide, the semiconductor layer structure comprising a source region and a trench formed therein;
a gate dielectric layer within the trench, the gate dielectric layer comprising a base gate dielectric layer that is on a top surface of the source region and a first capping gate dielectric layer on the base gate dielectric layer, the first capping gate dielectric layer comprising a different material than the base gate dielectric layer; and
a gate electrode in the trench on the gate dielectric layer opposite the semiconductor layer structure.

12. The semiconductor device of claim 11, wherein a dielectric constant of the first capping gate dielectric layer is higher than a dielectric constant of the base gate dielectric layer.

13. The semiconductor device of claim 12, wherein the first capping gate dielectric layer is in between the semiconductor layer structure and the base gate dielectric layer.

14. The semiconductor device of claim 13, further comprising a second capping gate dielectric layer that is in between the base gate dielectric layer and the gate electrode.

15. The semiconductor device of claim 12, wherein the first capping gate dielectric layer is in between the base gate dielectric layer and the gate electrode.

16. The semiconductor device of claim 15, further comprising a second capping gate dielectric layer that is in between the semiconductor layer structure and the base gate dielectric layer.

17. The semiconductor device of claim 11, wherein the gate dielectric layer comprises lower corners and upper corners, where at least one of the lower corners and upper corners comprises a rounded corner.

18. A semiconductor device, comprising:
a silicon carbide semiconductor layer structure that comprises a first conductivity type drift region, and first and second well regions in an upper surface of the first conductivity type drift region, the first and second well regions separated by a JFET region;
a gate dielectric layer on the silicon carbide semiconductor layer structure, the gate dielectric layer comprising a base gate dielectric layer that is on the silicon carbide semiconductor layer structure and a capping gate dielectric layer on the base gate dielectric layer, the capping gate dielectric layer comprising a different material than the base gate dielectric layer, wherein a dielectric constant of the capping gate dielectric layer is higher than a dielectric constant of the base gate dielectric layer, and the capping gate dielectric layer is thinner than a portion of the base gate dielectric layer that is below the capping gate dielectric layer; and
a gate electrode on the gate dielectric layer opposite the silicon carbide semiconductor layer structure.

19. The semiconductor device of claim 18, wherein the capping gate dielectric layer is not above the JFET region.

20. The semiconductor device of claim 19, wherein the base gate dielectric layer is in between the capping gate dielectric layer and the silicon carbide semiconductor layer structure.

21. A semiconductor device, comprising:
a silicon carbide semiconductor layer structure that comprises a first conductivity type drift region, and first and second well regions in an upper surface of the first conductivity type drift region, the first and second well regions separated by a JFET region;
a gate dielectric layer on the silicon carbide semiconductor layer structure, the gate dielectric layer comprising a base gate dielectric layer that is on the silicon carbide semiconductor layer structure and a capping gate dielectric layer on the base gate dielectric layer, the capping gate dielectric layer comprising a different material than the base gate dielectric layer; and
a gate electrode on the gate dielectric layer opposite the silicon carbide semiconductor layer structure,
wherein the gate electrode directly contacts both the capping gate dielectric layer and the base gate dielectric layer, and
wherein the gate dielectric layer extends laterally beyond sidewalls of the gate electrode.

22. The semiconductor device of claim 21, further comprising a dielectric isolation pattern that covers the gate electrode, wherein the dielectric isolation pattern directly contacts an upper surface of the capping gate dielectric layer.

23. The semiconductor device of claim 22, wherein a sidewall of the dielectric isolation pattern is aligned with a sidewall of the capping gate dielectric layer.

* * * * *